(12) United States Patent
Yun et al.

(10) Patent No.: US 10,123,434 B2
(45) Date of Patent: Nov. 6, 2018

(54) COUPLER AND HEAD MOUNTED DISPLAY DEVICE

(71) Applicant: Samsung Electronics Co., Ltd., Suwon-si, Gyeonggi-do (KR)

(72) Inventors: Suk Jin Yun, Seoul (KR); Tae Seuk Kang, Suwon-si (KR); Dong Hyun Byun, Suwon-si (KR); Sang Jin Wang, Suwon-si (KR); Min Hwa Jeong, Suwon-si (KR); Jin Hyeok Heo, Daegu (KR); Ji Seong Hwang, Suwon-si (KR); Min Woo Yoo, Osan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 36 days.

(21) Appl. No.: 15/270,605

(22) Filed: Sep. 20, 2016

(65) Prior Publication Data

US 2017/0094816 A1    Mar. 30, 2017

(30) Foreign Application Priority Data

Sep. 25, 2015    (KR) ......................... 10-2015-0136466

(51) Int. Cl.
*H05K 5/00*    (2006.01)
*H05K 5/02*    (2006.01)
(Continued)

(52) U.S. Cl.
CPC ....... *H05K 5/0017* (2013.01); *G02B 27/0176* (2013.01); *G02B 27/022* (2013.01);
(Continued)

(58) Field of Classification Search
CPC ............. G02B 27/017; G02B 27/0176; G02B 27/0179; G02B 27/022; G02B 27/028;
(Continued)

(56) References Cited

U.S. PATENT DOCUMENTS 6,319,034 B1    11/2001    Takakura et al.
8,643,568 B2 *   2/2014    West .................. G02B 27/0176
                                                          345/7

(Continued)

FOREIGN PATENT DOCUMENTS

GB        2499102 A        7/2013
KR     20140013676 A        2/2014
KR       101419007 B1       7/2014

*Primary Examiner* — Loha Ben
(74) *Attorney, Agent, or Firm* — Jefferson IP Law, LLP

(57) ABSTRACT

A head mounted display device is provided. The head mounted display device includes a main frame including a lens, a front case including a seating area in which an electronic device is seated, a peripheral area that surrounds at least a portion of a periphery of the electronic device, a connector holder that is horizontally movable from one side of the peripheral area and that is electrically connected to a connection port of the electronic device while surrounding at least a portion of one side of the electronic device when the electronic device is mounted, and a fixing holder that is horizontally movable from one side of the peripheral area and that surrounds a portion of an opposite side surface of the electronic device when the electronic device is mounted.

20 Claims, 33 Drawing Sheets

(51) Int. Cl.
*G06F 1/16* (2006.01)
*G02B 7/02* (2006.01)
*G09G 5/00* (2006.01)
*G02B 27/02* (2006.01)
*H05K 5/03* (2006.01)
*G06F 3/01* (2006.01)
*H04M 1/04* (2006.01)
*G02B 27/01* (2006.01)

(52) U.S. Cl.
CPC ........... *G02B 27/028* (2013.01); *G06F 1/163* (2013.01); *G06F 1/1632* (2013.01); *G06F 3/011* (2013.01); *G09G 5/00* (2013.01); *H05K 5/0013* (2013.01); *H05K 5/0204* (2013.01); *H05K 5/0217* (2013.01); *H05K 5/03* (2013.01); *G02B 2027/014* (2013.01); *G02B 2027/0132* (2013.01); *H04M 1/04* (2013.01)

(58) Field of Classification Search
CPC .... G02B 2027/0161; G02B 2027/0163; G02B 2027/0132; G02B 2027/014; H05K 5/0013; H05K 5/0017; H05K 5/0204; H05K 5/0217; H05K 5/03; G06F 1/163; G06F 1/1632; G06F 3/011; H04M 1/04; G09G 5/00
USPC ....... 359/630–632, 804; 345/7–9; 455/575.1, 455/575.2, 575.4, 575.8
See application file for complete search history.

(56) References Cited

U.S. PATENT DOCUMENTS

| | | | |
|---|---|---|---|
| 8,957,835 B2* | 2/2015 | Hoellwarth | G02B 27/017 345/8 |
| 9,429,759 B2* | 8/2016 | Hoellwarth | G02B 27/017 |
| 9,615,476 B2* | 4/2017 | Rayner | H05K 5/061 |
| 9,660,684 B2* | 5/2017 | Rayner | H04B 1/3888 |
| 9,733,482 B2* | 8/2017 | West | G02B 27/0176 |
| 2010/0079356 A1 | 4/2010 | Hoellwarth | |
| 2013/0092805 A1 | 4/2013 | Funk et al. | |
| 2013/0092811 A1 | 4/2013 | Funk et al. | |
| 2013/0277520 A1 | 10/2013 | Funk et al. | |
| 2015/0138645 A1 | 5/2015 | Yoo et al. | |
| 2015/0198811 A1 | 7/2015 | Hoellwarth | |
| 2015/0234189 A1 | 8/2015 | Lyons | |
| 2015/0234192 A1 | 8/2015 | Lyons | |
| 2015/0234193 A1 | 8/2015 | Lyons | |
| 2015/0234501 A1 | 8/2015 | Lyons | |
| 2015/0235426 A1 | 8/2015 | Lyons | |
| 2015/0253574 A1 | 9/2015 | Thurber | |
| 2016/0085076 A1 | 3/2016 | Hoellwarth | |
| 2016/0253006 A1 | 9/2016 | Lyons | |
| 2016/0334628 A1 | 11/2016 | Lyons | |
| 2017/0003712 A1 | 1/2017 | Funk et al. | |

* cited by examiner

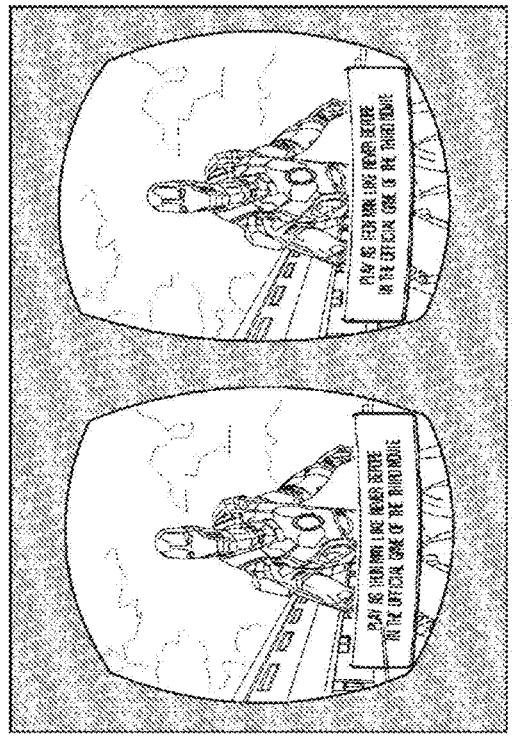
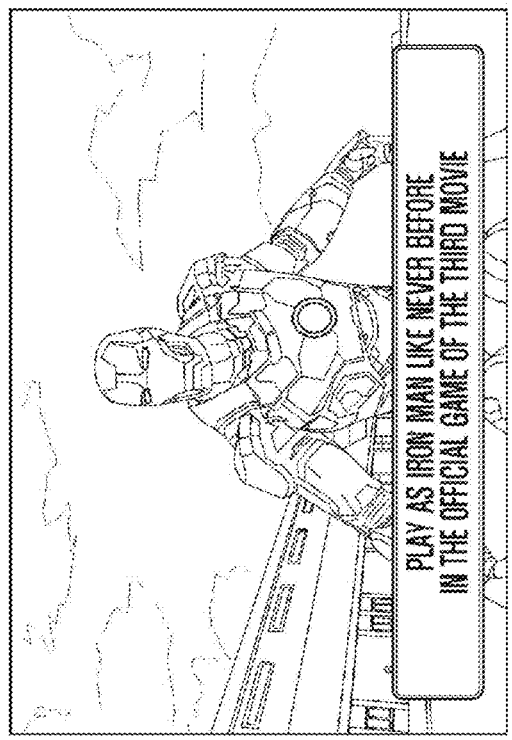
FIG. 11

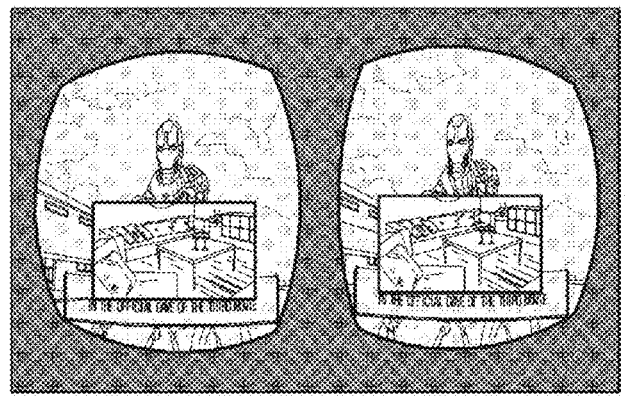
PIP mode
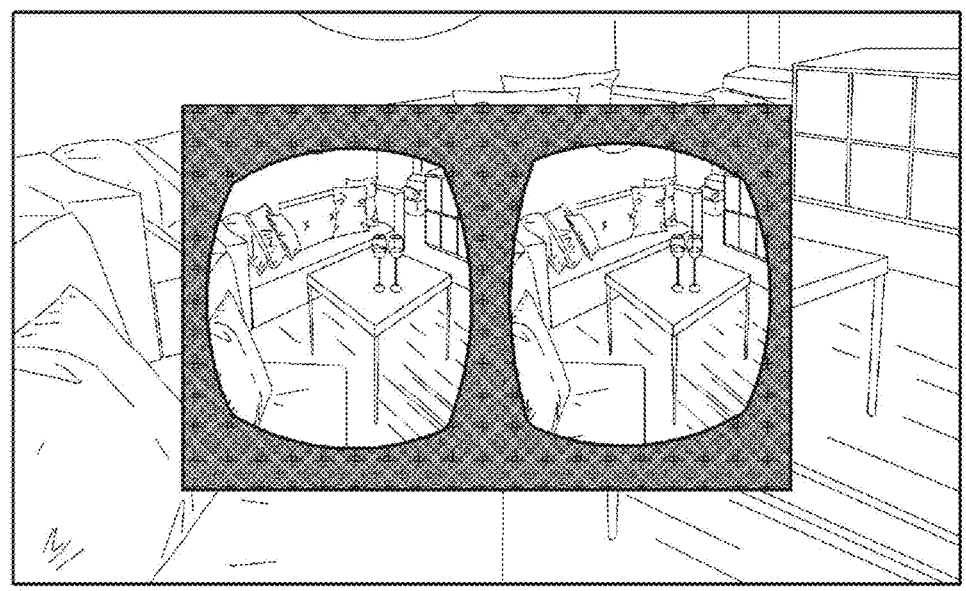
See-throught mode
FIG. 12

COUPLER AND HEAD MOUNTED DISPLAY DEVICE

CROSS-REFERENCE TO RELATED APPLICATION(S)

This application claims the benefit under 35 U.S.C. § 119(a) of a Korean patent application filed on Sep. 25, 2015, in the Korean Intellectual Property Office and assigned Serial number 10-2015-0136466, the entire disclosure of which is hereby incorporated by reference.

TECHNICAL FIELD

The present disclosure relates to a head mounted display device.

BACKGROUND

In recent years, various electronic devices that may be mounted on the body of the user have been developed. The devices are generally called wearable electronic devices.

The wearable electronic devices that may be mounted on any part of the body, for example, may include a head mounted display (HMD) device that is mounted on the head of the user to display an image, a smart glass, a smart watch or wristband, a contact lens type device, a ring type device, a shoe type device, a cloth type device, and a grove type device, and may be variously attached to or detached from a part of the human body or clothes, and in particular, the HMD device may have a goggle shape or an eye glass shape.

The wearable electronic device may improve portability and accessibility of the user as it is directly mounted to the body.

The HMD device may be configured such that an electronic device is mounted on a frame thereof. However, the electronic devices have been developed to have various sizes and shapes. Accordingly, because the HMD devices need to be variously manufactured according to the forms of the electronic devices, they have many problems in aspects of manufacturing lines and sales.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a coupler that may mount and fix an electronic device without the form of the electronic device being limited, and a head mounted display device including the same.

In accordance with an aspect of the present disclosure, a head mounted display device is provided. The head mounted display device includes a main frame including a lens, a front case including a seating area in which an electronic device is seated, and a peripheral area that surrounds at least a portion of a periphery of the electronic device, a connector holder that is horizontally movable from one side of the peripheral area with respect to a bottom of the seating area of the front case and that is electrically connected to a connection port of the electronic device while surrounding at least a portion of one side of the electronic device when the electronic device is mounted and a fixing holder that is horizontally movable from one side of the peripheral area with respect to the bottom of the seating area of the front case and that surrounds a portion of an opposite side surface of the electronic device when the electronic device is mounted.

In accordance with another aspect of the present disclosure, a coupler is provided. The coupler includes a front case including a seating area in which the electronic device is seated, and a peripheral area that surrounds a periphery of the electronic device, and the front case including a connector holder configured to be horizontally moved from one side of the peripheral area with respect to a bottom of the seating area of the front case and electrically connected to a connection port of the electronic device while surrounding at least a portion of a side surface of one side of the electronic device when the electronic device is mounted and a fixing holder that is horizontally moved from one side of the peripheral area with respect to the bottom of the seating area of the front case and that surrounds a portion of an opposite side surface of the electronic device when the electronic device is mounted.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 8I is an exploded perspective view of a fixing holder and a front case according to an embodiment of the present disclosure;

FIG. 11 is a view illustrating a normal mode, a head mounted mode (HMI), or a virtual reality (VR) mode of an HMD device according to an embodiment of the present disclosure; and FIG. 12 is a view illustrating that an HMD device provides a see-through mode by using a rear camera of a smartphone according to an embodiment of the present disclosure.

Throughout the drawings, it should be noted that like reference numbers are used to depict the same or similar elements, features, and structures.

DETAILED DESCRIPTION

Figure 1:
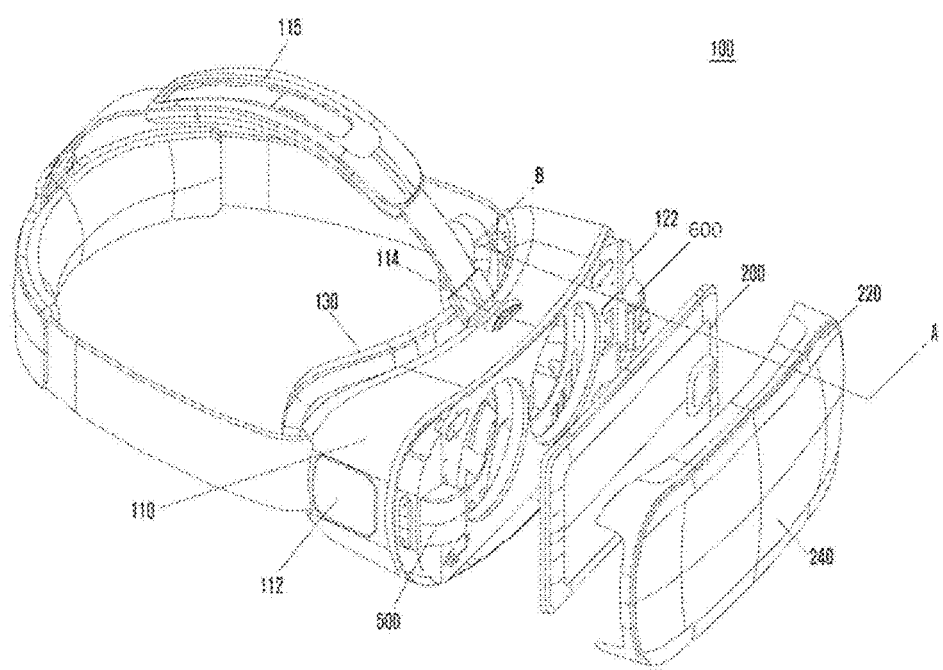
FIG. 1 is a perspective view illustrating a configuration of a head mounted display (HMD) device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "have", "may have", "include", "may include", "comprise", and the like used herein indicate the existence of a corresponding feature (e.g., a number, a function, an operation, or an element) and do not exclude the existence of an additional feature.

The terms "A or B", "at least one of A and/or B", or "one or more of A and/or B" may include all possible combinations of items listed together. For example, the terms "A or B", "at least one of A and B", or "at least one of A or B" may indicate all the cases of (1) including at least one A, (2) including at least one B, and (3) including at least one A and at least one B.

The terms "first", "second", and the like used herein may modify various elements regardless of the order and/or priority thereof, and are used only for distinguishing one element from another element, without limiting the elements. For example, "a first user device" and "a second user device" may indicate different user devices regardless of the order or priority. For example, without departing the scope of the present disclosure, a first element may be referred to as a second element and vice versa.

It will be understood that when a certain element (e.g., a first element) is referred to as being "operatively or communicatively coupled with/to" or "connected to" another element (e.g., a second element), the certain element may be coupled to the other element directly or via another element (e.g., a third element). However, when a certain element (e.g., a first element) is referred to as being "directly coupled" or "directly connected" to another element (e.g., a second element), there may be no intervening element (e.g., a third element) between the element and the other element.

The term "configured (or set) to" as used herein may be interchangeably used with the terms, for example, "suitable for", "having the capacity to", "designed to", "adapted to", "made to", or "capable of". The term "configured (or set) to" may not necessarily have the meaning of "specifically designed to". In some cases, the term "device configured to" may indicate that the device "may perform" together with other devices or components. For example, the term "processor configured (or set) to perform A, B, and C" may represent a dedicated processor (e.g., an embedded processor) for performing a corresponding operation, or a general-purpose processor (e.g., a central processing unit (CPU) or an application processor) for executing at least one software program stored in a memory device to perform a corresponding operation.

The terminology herein is only used for describing specific embodiments and is not intended to limit the scope of other embodiments. The terms of a singular form may include plural forms unless otherwise specified. The terms used herein, including technical or scientific terms, have the same meanings as understood by those of ordinary skill in the art. Terms defined in general dictionaries, among the terms used herein, may be interpreted as having meanings that are the same as, or similar to, contextual meanings defined in the related art, and should not be interpreted in an idealized or overly formal sense unless otherwise defined explicitly. Depending on the case, even the terms defined herein should not be such interpreted as to exclude various embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a motion picture experts group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted display (HMD) device), a textile- or clothing-integrated-type device (e.g., an electronic apparel), a body-attached-type device (e.g., a skin pad or a tattoo), or a bio-implantable-type device (e.g., an implantable circuit).

According to an embodiment of the present disclosure, an electronic device may be a home appliance. The home appliance may include at least one of, for example, a television (TV), a digital versatile disc (DVD) player, an audio player, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google a game console (e.g., Xbox™ or PlayStation™), an electronic dictionary, an electronic key, a camcorder, or an electronic picture frame.

According to an embodiment of the present disclosure, an electronic device may include at least one of various medical devices (e.g., various portable medical measurement devices (e.g., a blood glucose measuring device, a heart rate measuring device, a blood pressure measuring device, a body temperature measuring device, and the like), a magnetic resonance angiography (MRA) device, a magnetic resonance imaging (MRI) device, a computed tomography (CT) device, a scanner, an ultrasonic device, and the like), a navigation device, a global navigation satellite system (GNSS), an event data recorder (EDR), a flight data recorder (FDR), a vehicle infotainment device, electronic equipment for vessels (e.g., a navigation system, a gyrocompass, and the like), avionics, a security device, a head unit for a vehicle, an industrial or home robot, an automatic teller machine (ATM), a point of sales (POS) terminal, or an Internet of Things (IoT) device (e.g., a light bulb, various sensors, an electric or gas meter, a sprinkler, a fire alarm, a thermostat, a streetlamp, a toaster, exercise equipment, a hot water tank, a heater, a boiler, and the like).

According to an embodiment of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, and the like). An electronic device may be one or more combinations of the above-mentioned devices. An electronic device may be a flexible device. An electronic device is not limited to the above-mentioned devices and may include new electronic devices with the development of new technology.

Hereinafter, an electronic device according to an embodiment of the present disclosure will be described with reference to the accompanying drawings. The term "user" as used herein may refer to a person who uses an electronic device or may refer to a device (e.g., an artificial intelligence device) that uses an electronic device.

A HMD device according to various embodiments of the present disclosure may provide at least one of a see-through mode that provides an augmented reality (AR) mode or a see-closed mode that provides a virtual reality (VR) image through a display.

The see-through mode may generally refer to a mode of, for example, in a Google Glass™, displaying content (e.g., an image or a virtual object) to a user such that the user perceives the content as well as objects in the external environment within the field of view of the user. The content displayed while the HMD device is in see-through mode may be displayed on a display or transparent/translucent lenses. In the see-through mode, additional information and/or images associated with objects in the external environment of the user may be provided to the user.

The see-closed mode may generally refer to a mode of, for example in a Sony HMZ™, displaying additional information to the user by using a hologram. In the see-closed mode, an image is created by projecting two or more beams of light to create a stereoscopic image using light interference such that the user may view content (e.g., a game, a movie, a steaming broadcast, etc.) as a three-dimensional image within the HMD. When a see-closed mode is implemented the user may feel immersed within the content. Accordingly, the HMD device of the present disclosure may be differentiated from an existing HMD device.

An electronic device that is detachably mounted to a main frame of the HMD device according to various embodiments of the present disclosure may further include a communication function.

FIG. 1 illustrates a configuration of an HMD device according to an embodiment of the present disclosure.

Figure 2:
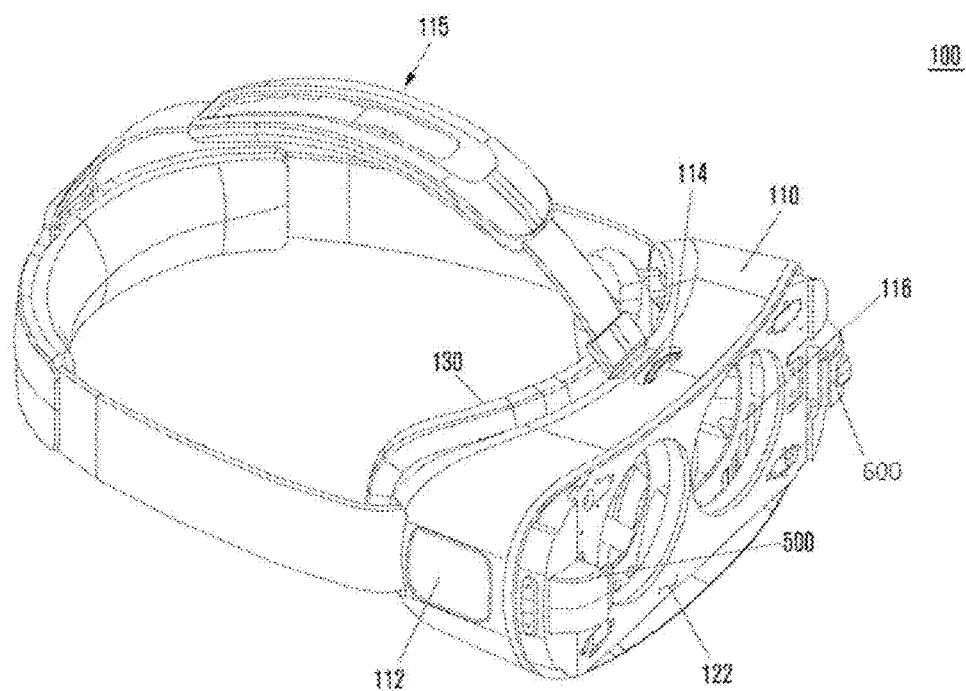
FIG. 2 is a perspective view of a main frame in a state in which the HMD device of FIG. 1 is not coupled to an electronic device according to an embodiment of the present disclosure.

FIG. 2 is a view illustrating a state in which neither an electronic device nor a cover is mounted on an HMD device according to an embodiment of the present disclosure.

Figure 3:
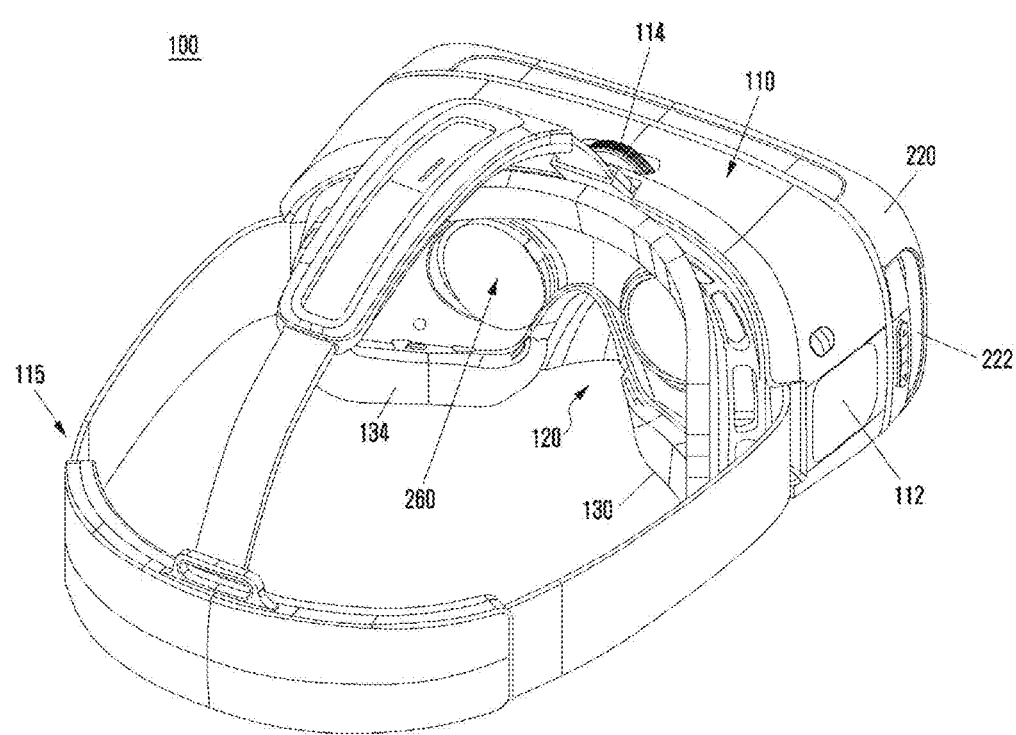
FIG. 3 is a rear perspective view of FIG. 2 in a state in which the electronic device and a cover are mounted on the HMD device according to an embodiment of the present disclosure.

FIG. 3 is a perspective view illustrating a state in which an electronic device and a cover are mounted on an HMD device according to an embodiment of the present disclosure.

Figure 4:
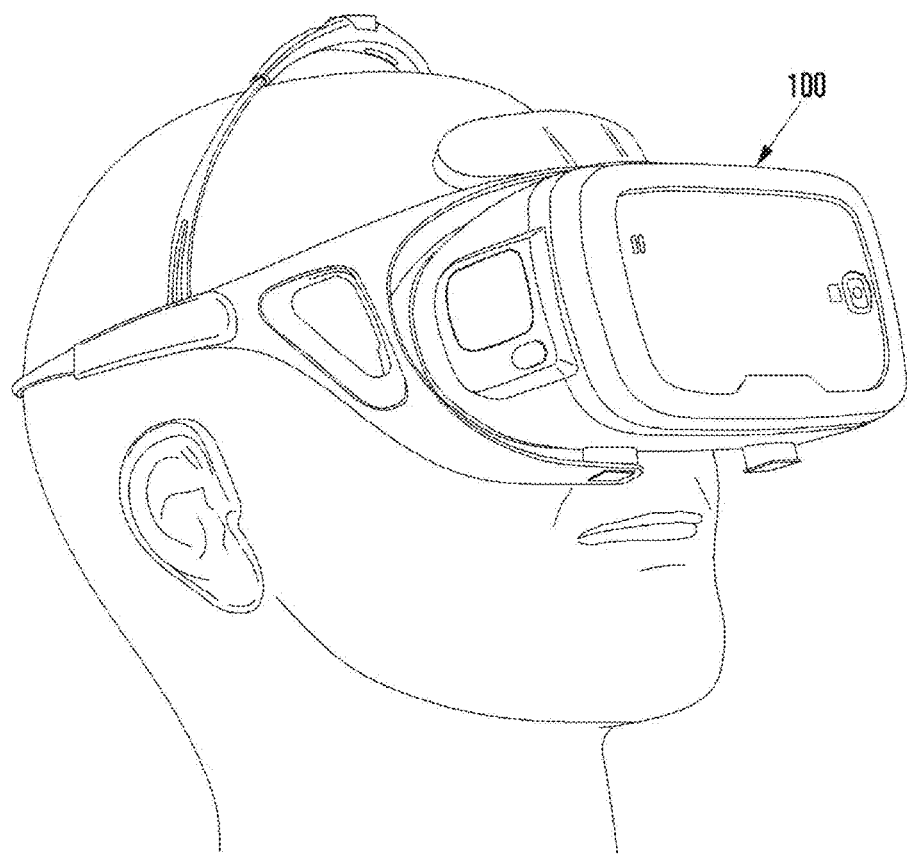
FIG. 4 is a state view illustrating that the user wears the HMD device of FIG. 2 according to an embodiment of the present disclosure.

FIG. 4 is a view illustrating that the user wears a HMD device according to an embodiment of the present disclosure.

Referring to FIGS. 1 to 4, an HMD device 100, according to various embodiments of the present disclosure, may include a main frame 110 and a support 115 (for example, a band). According to various embodiments, the HMD device 100 may include only a part of the support 115 situated around the head of the user while a part situated over the head of the user is excluded.

The main frame 110 may be mounted on at least a portion (for example, a facial side) of the face of the user and may be supported on the facial side of the user by using various elements.

In an embodiment, the main frame 110 may be secured to surround the peripheries of eyes of the user by adjusting the length of a band of the support 115, which is formed of a resilient material. Cushions may be attached to the band to provide comfort or support when the HMD device 100 is operated for an extended period of time. Additionally, or alternatively, the support 115 may include eyeglass temples, a helmet, and/or a strap.

The rear surface of the main frame 110 may include a part in contact with the facial side of the user. For example, a facial side contact part 130, may have a structure to correspond to a curve of the face of the user and may at least partially include a resilient body 134. At least a portion of the resilient body 134 may be formed of at least one cushion such as a sponge or padding to provide comfort or support to the user when the facial side contact part 130 is in contact with the user. The resilient body 134 may include one sponge, or may be one in which one or more sponges having different compression values or density are combined. For example, the resilient body 134 may be a sponge in which three layers (for example, an upper layer, an intermediate layer, and a lower layer) are combined, wherein the upper and lower layers may be formed of a sponge having a low compression value and the intermediate layer may be formed of a sponge having a high compression value.

According to another embodiment, the resilient body 134 may be removably attached to the main frame 110 such that the resilient body 134 may be separable from the main frame 110. One surface of the resilient body 134 may include a bonding member. The bonding member included in the resilient body 134 may be used to attach and detach the resilient body 134 to and from the main frame 110. The bonding member may be Velcro™, tape, or an adhesive, but the present disclosure is not limited thereto and any bonding members for attachment and detachment may be used. By using a removable resilient body 134, when one HMD device 100 is used by several users, the resilient body 134 may be changed between different users to best suit the individual user. For example, a resilient body 134 may be configured for adults or children or a resilient body 134 may include different contours to correspond with different facial features and/or structures, etc. In addition, when a surface of the resilient body 134 is contaminated (for example, by cosmetics, sweat, etc.) or at least a portion of the resilient body 134 is damaged due to frequent uses thereof, the resilient body 134 may be replaced by another resilient body 134 when the HMD device 100 is used.

In the HMD 100 of the present disclosure, for example, the shape or structure of the main frame 110 may have an external shape that covers the eyes of the user and may include a nose recess 120 on an internal surface such that the nose of the user may be situated in the nose recess 120 so that the HMD device 100 may be easily mounted on the face of the user. A lens assembly including at least one lens may be inserted into the facial side contact part 130 at a location corresponding to the eyes of the user. When the user wears the HMD device 100, at least one surface of the lens may be exposed to the facial side contact part 130 such that a screen of an electronic device 200 may be viewed by the user.

Further, the main frame 110 may be formed of a material that is lightweight and may support the electronic device 200, for example, a plastic material.

The main frame 110 may further include a protective material for protecting the HMD device 100 of the present disclosure. As another embodiment, the protective material may include at least one of various materials, for example, glass, plastic (for example, ABS or polycarbonate), ceramics, metal (for example, aluminum), or a metal alloy (for example, steel, stainless steel, titanium, or a magnesium alloy), for increasing strength or rigidity.

The main frame 110 may include a touch pad 112, a display position adjusting part 114, and a lens fixing part 116. Further, a front case 122 having a space or structure for coupling may be formed on a front surface of the main frame 110. The main frame 110 may further include a connector to communicate with the electronic device 200 that has been removably coupled to the main frame 110.

In an embodiment, the connector may include a universal serial bus (USB) connector that may be connected to an electrical connection part of the electronic device 200, for example, a USB port, and a signal of a graphic user interface (GUI) may be provided to the electronic device 200 through an electrical connection part of the USB connector.

The front case 122 of the main frame 110 may correspond to an outer shape of the electronic device 200. In an embodiment, the front case 122 may include a resilient material or a flexible material to receive an electronic device 200 of various sizes.

The HMD device 100 according to various embodiments of the present disclosure may further include a cover 220. The cover 220 may secure at least a portion of the electronic device 200 to the main frame 110.

The cover 220 may be physically coupled to the main frame 110 in the form of a hook or in a manner using, for example, a magnet or an electromagnet. In this way, the cover 220 may additionally prevent the electronic device 200 from unintentionally separating from the main frame 110 and may improve an aesthetic aspect while constituting an external appearance of the main frame 110.

The cover 220 may further include a window 240 on a front surface thereof. The window 240 functions to improve an aesthetic aspect through various materials and various colors. The window 240 may be formed of a general plastic material such as polycarbonate (PC) or acryl, may be manufactured of a ceramic material such as glass, sapphire, or transparent ceramics, and also may be manufactured of a metallic material such as aluminum or stainless steel. When the window 240 is formed of a transparent material, it may include a color or may include a material which allows for a transparency of the window 240 to be adjusted.

Further, the cover 220 may further include one or more openings 222. The openings 222 may easily emit heat generated by the electronic device 200 to the outside of the cover 220 and thus may prevent a deterioration of a performance of the electronic device 200 due to heat by lowering the temperature of the electronic device 200. Further, the weight of the cover 220 may be made lighter due to the one or more openings 222 so that the overall weight of the HMD device 100 may be reduced, which is helpful for weight lightening.

A display or a transparent/translucent lens 260 may be integrally or detachably fixed to the lens fixing part 116 of the main frame 110. In an embodiment, a lens assembly may be inserted between the electronic device 200 and the user. The rear surface of the main frame 110 may be formed of a soft material (for example, sponge or rubber) to prevent the main frame 110 from becoming undesirably adhered to the peripheries of the eyes of the user.

In an embodiment, the main frame 110 may include a control device that may control the electronic device 200 or a user input module.

The control device may include at least one of a touch pad 112, a physical key, a physical button, a touch key, a joystick, or a wheel on a side surface of the main frame 110.

In the present embodiment, the touch pad 112 may display a GUI through which a function of the electronic device 200 may be controlled. For example, a volume of an audio that is output from the electronic device 200 may be adjusted through a GUI for setting of a sound or an image that is displayed by the electronic device 200 may be controlled through a GUI for reproduction of an image. Further, the touch pad 112 may receive a touch input (for example, an input that is made by directly touching the touch pad 112) or a hovering input of the user. Because the HMD device 100 of the present disclosure is connected to the electronic device 200 by using an interface of an USB or the like, the received touch input may be transmitted to the electronic device 200.

The electronic device 200 may control a function corresponding to a touch input in response to the touch input that has been received from the HMD device 100. For example, the electronic device 200 may adjust a volume or control reproduction of an image at the electronic device 200 in response to the received touch input received at the touch pad 112.

According to an embodiment, the display position adjusting part 114 may have a form of a wheel or a dial. If the user turns a wheel or a dial that is implemented as the display position adjusting part 114, the electronic device 200 may be moved such that a distance between the display of the electronic device 200 and the user may be adjusted, and as a result, the user may adjust the location of the electronic device 200 to watch an image that is suitable for his or her sight or displayed optimally. Meanwhile, the front case 122 of the main frame 110 may include a connector holder 500 and a fixing holder 600 that may be used to secure the electronic device 200 to the main frame 110.

Figure 5A:
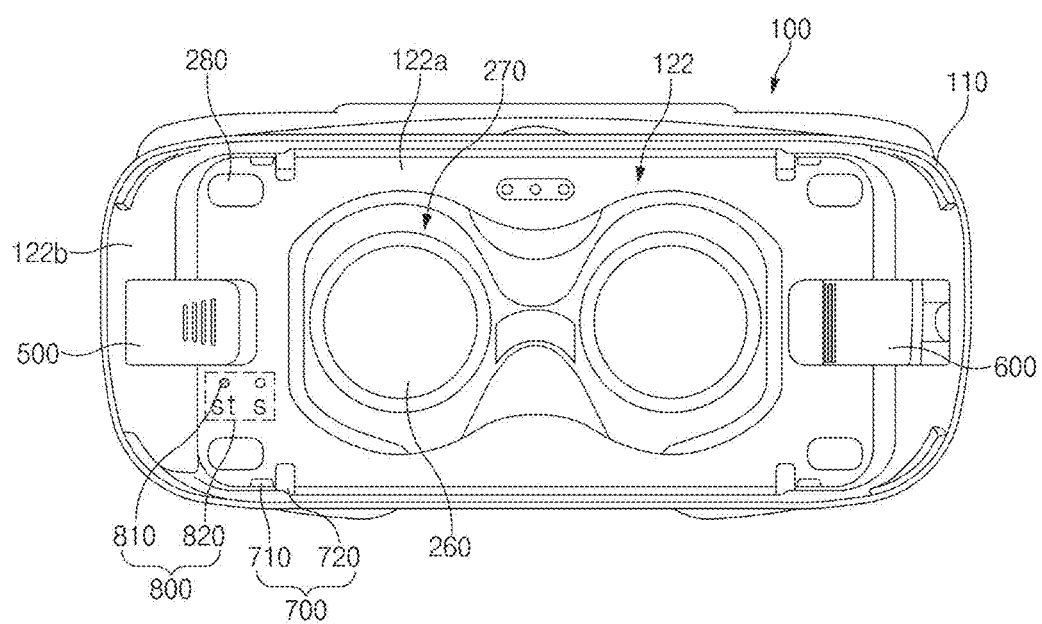
FIG. 5A is a view illustrating a connector holder of a front case of the HMD device in a first state according to an embodiment of the present disclosure.

FIG. 5A is a view illustrating a connector holder of a front case of the HMD device in a first state according to an embodiment of the present disclosure.

Referring to FIG. 5A, the HMD device 100 may include a front case 122 of the main frame 110. The front case 122 may include a lens hole 270 in which the lens 260 is situated, a device protecting part 280 arranged away from the lens hole 270, a device side wall protecting part 700, a connector holder 500, and a fixing holder 600. Further, the front case 122 may include an indication part 800 that indicates the type of a device. The front case 122 may also include a seating area 122a in which the electronic device 200 is seated at a central portion thereof and a peripheral area 122b that surrounds the seating area 122a. The lens hole 270, the device protecting part 280, and the device side wall protecting part 700 may be arranged in the seating area 122a. The connector holder 500 and the fixing holder 600 are arranged in the peripheral area 122b and at least a portion of the connector holder 500 and the fixing holder 600 may protrude to the seating area 122a.

The lens hole 270, for example, may be arranged at a central portion of the front case 122 and the lens hole 270 may have a specific size. For example, the lens hole 270 may include two holes which correspond to the two eyes of the user. Alternatively, the lens hole 270 may include one hole.

The device protecting part 280 may protrude from a bottom surface of the seating area 122a of the front case 122 at a specific location of the front case 122 outside of the lens hole 270. The device protecting part 280 may physically contact the electronic device 200 when the electronic device 200 is mounted on the seating area 122a of the front case 122. The device protecting part 280 may be formed of a material having a tension, a cushion, or a density. For example, the device protecting part 280 may be formed of various materials such as a rubber material, a cotton flannel material, and a silk material. Referring to the drawings, although the device protecting part 280 may be situated at four sites of the seating area 122a, the embodiments of the present disclosure are not limited thereto. For example, one or more device protecting parts 280 may be arranged. Further, the device protecting parts 280 may be arranged at symmetrical locations of a periphery of the seating area 122a such that the electronic device 200 may be uniformly seated in the seating area 122a.

The device side wall protecting part 700, for example, may protect a side wall of the electronic device 200 that is seated in the seating area 122a of the front case 122. The device side wall protecting part 700, for example, may be arranged in an area that is adjacent to an area in which the device protecting part 280 is arranged. Alternatively, the device side wall protecting part 700 may be arranged on at least one side of a peripheral area of the seating area 122a. The device side wall protecting part 700 may be arranged in forms corresponding to the various forms of the electronic devices 200. The device side wall protecting part 700, for example, may include a first side wall protector 710 that protects a side wall of one type of electronic device and a second side wall protector 720 that protects a side wall of a different type of electronic device. Another example of the device side wall protecting part 700 will be described with reference to FIGS. 9A and 9B.

The connector holder 500, for example, may be arranged on at least one of the left side or the right side of the front case 122. For example, a connector that may be electrically connected to the electronic device 200 may be arranged in the connector holder 500. Further, the connector holder 500 may have a form (for example, a C shape) that surrounds a side wall of the electronic device 200 while being connected to the connector. Accordingly, the connector holder 500 may have an E shape when both the connector and the shape that surrounds the side wall of the electronic device 200 are arranged. The connector holder 500 may be adjusted into various states by an external pressure. For example, the connector holder 500 may be, for example, in a state in which it protrudes further towards the seating area 122a of the front case 122, a state in which it is inclined towards the peripheral area 122b of the front case 122, a state in which it is rotated in the first direction (for example, upwards) about the bottom of the seating area 122a of the front case 122 from the state in which it is further protrudes towards the seating area 122a, and a state in which it is rotated upwards about the bottom of the seating area 122a of the front case 122 from the state in which it is inclined towards the peripheral area 122b.

As illustrated, the connector holder 500 of FIG. 5A may have a first state in which it is inclined towards the peripheral area 122b of the front case 122. As described above, the connector holder 500 may be provided to transversely move toward a central portion of the front case 122 or a periphery of the front case 122 with respect to a direction that is parallel to the front case 122. Further, the connector holder 500 may be rotated upwards about the bottom of the seating area 122a of the front case 122 and then may be rotated towards the bottom of the seating area 122a again.

The fixing holder 600 may be arranged in the peripheral area 122b of the front case 122 that is symmetrical to the connector holder 500 with respect to a longitudinal central line of the front case 122. As described above, at least a portion of the fixing holder 600 may protrude towards the seating area 122a of the front case 122. The fixing holder 600 may be moved by a specific length in a transverse direction of the front case 122 in the illustrated drawing. According to various embodiments, the fixing holder 600 may include a resilient member and the resilient member may provide a resilient force towards a central portion of the seating area 122a of the front case 122.

The indication part 800 may include a plurality of print areas 820 that indicate a type of the electronic device 200 seated in the front case 122 and an exposure hole 810 that exposes at least a portion of the indication part 800 that indicates the type of any one electronic device 200 according to a movement state of the connector holder 500. The print area 820, for example, may be printed on the bottom of the seating area 122a of the front case 122. Further, the printed area may be engraved or embossed on the bottom of the seating area 122a. The exposure hole 810 may be arranged at a portion of the bottom of the seating area 122a such that at least a portion of the indicator arranged below the exposure hole 810 may be exposed to the outside. The indication part 800 may be arranged on one side of the connector holder 500 and a location of the indication part 800 may be changed as the connector holder 500 moves. According to an embodiment, while the connector holder 500 is inclined towards the peripheral area 122b of the front case 122, the indication part 800 may be exposed through the exposure hole 810 that indicates one of the print areas 820 of the indication part 800, which is related to a first type of electronic device. Further, while the connector holder 500 is inclined towards the seating area 122a of the front case 122, the indication part 800 may be exposed through the exposure hole 810 that indicates one of the print areas 820 of the indication part 800, which is related to a second type of electronic device.

As described above, in the HMD device 100 according to an embodiment, the connector holder 500 and the fixing holder 600 may be moved from the central portion of the front case 122 towards the outside or from the outside towards the central portion of the front case 122. Accordingly, the HMD device 100 may fix displays of electronic devices having various sizes and lengths at a specific location of an area of the lens hole 270. Further, because the HMD device 100 is configured such that the connector holder 500 and the fixing holder 600 are rotatable upwards and downwards about the front surface of the front case 122, the electronic device 200 may be easily inserted and separated.

Figure 5B:
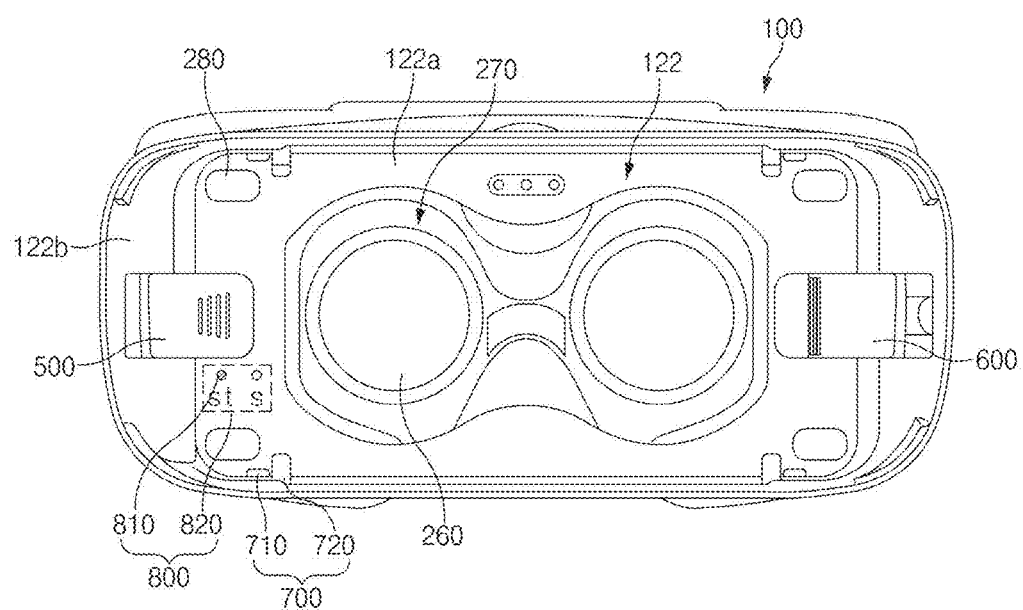
FIG. 5B is a view illustrating the connector holder of the front case of the HMD device in a second state according to an embodiment of the present disclosure.

FIG. 5B is a view illustrating the connector holder of the front case of the HMD device in a second state according to an embodiment of the present disclosure.

Referring to FIG. 5B, according to an embodiment, as illustrated, the connector holder 500 of the HMD device 100 may be in a second state in which it is horizontally movable to further protrude towards the seating area 122a of the front case 122. According to various embodiments, the connector holder 500 may be moved in a horizontal direction of the front case 122 while being pressed towards the inside of the main frame 110 (for example, towards the facial side) by a specific height and applying a pressure from the upper side of the front case 122 in a direction that faces the bottom of the seating area 122a of the front case 122 (a direction perpendicular to the seating area 122a of the front case 122). According to an embodiment, the user may change a position of the connector holder 500 by applying a force towards the left side or right side of the front case 122 while an upper portion of the connector holder 500 is pressed towards the mounting side of the main frame 110.

FIG. 5B illustrates a movement state of the connector holder 500 when a force is applied towards the central portion of the seating area 122a of the front case 122 (for example, rightwards) while applying a force to the connector holder 500 of FIG. 5A vertically downwards. As the connector holder 500 moves, the indication part 800 arranged on one side of the connector holder 500 and at least a portion of which is exposed through a hole formed in the seating area 122a may indicate a designated print area 820 that expresses another type of electronic device.

Figure 5C:
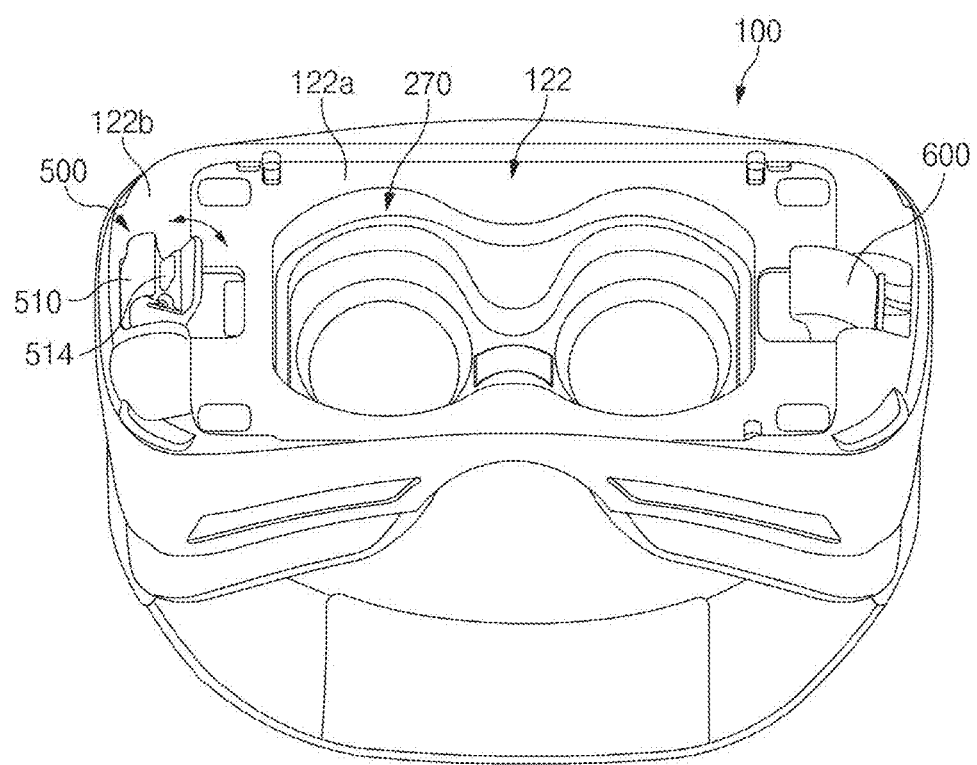
FIG. 5C is a view illustrating the connector holder of the front case of the HMD device in a third state according to an embodiment of the present disclosure.

FIG. 5C is a view illustrating the connector holder of the front case of the HMD device in a third state according to an embodiment of the present disclosure.

Referring to FIG. 5C, as illustrated, the connector holder 500 of the HMD device 100 may be configured to be rotatable upwards about the bottom of the seating area 122a of the front case 122. Accordingly, the connector holder 500 may be in a third state in which it is rotated in one direction from the first state. For example, the user may apply a force using a curved motion of the connector holder 500 while gripping one end (for example, a right end) of the connector holder 500. Accordingly, as illustrated, a binder 510 arranged parallel to the seating area 122a of the front case 122 may be arranged to face the front side of the front case 122. While the binder 510 faces the front side (for example, the sky) of the front case 122, the connector 514 arranged inside the binder 510 may be exposed. The user may insert one side of the electronic device 200 into the connector 514. For example, a USB port of the electronic device 200 may be coupled with the connector 514. According to various embodiments, when the length of the electronic device 200 is a first size or a first length, as illustrated, the binder 510 of the connector holder 500 is inclined towards the peripheral area 122b, and the user may arrange the electronic device 200 having the first size or the first length at a central portion of the lens hole 270 by inserting the electronic device 200 into the fixing holder 600 after inserting the electronic device 200 into the connector holder 500 to fix the electronic device 200.

Figure 5D:
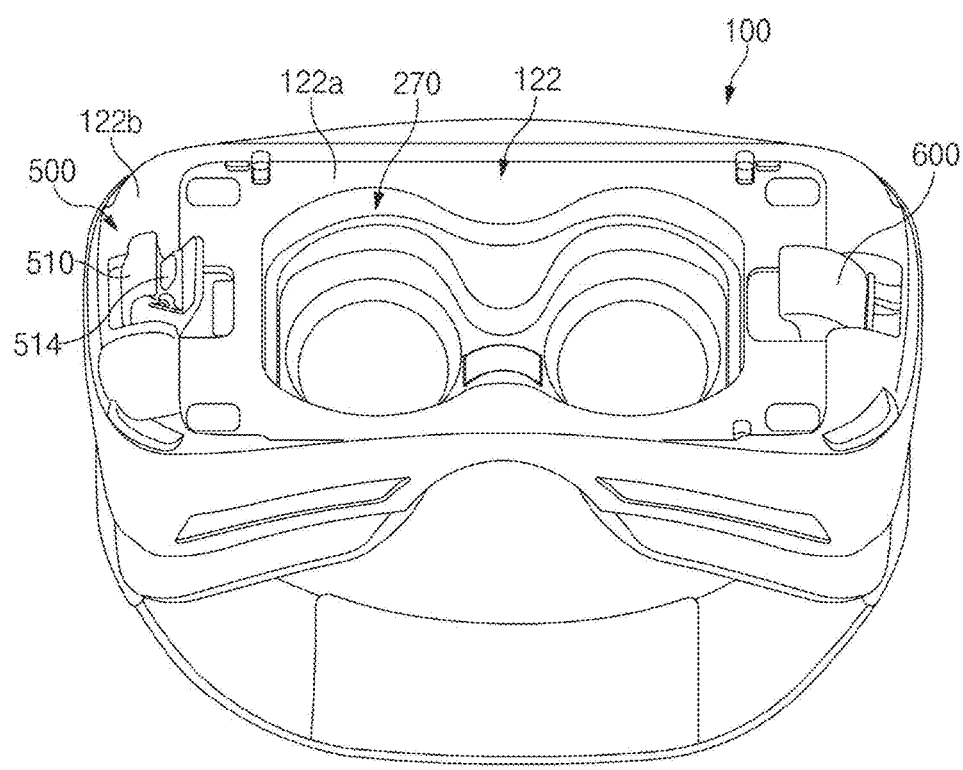
FIG. 5D is a view illustrating the connector holder of the front case of the HMD device in a fourth state according to an embodiment of the present disclosure.

FIG. 5D is a view illustrating the connector holder of the front case of the HMD device in a fourth state according to an embodiment of the present disclosure.

Referring to FIG. 5D, the connector holder 500 of the HMD device 100 may be in a fourth state in which it is rotated in a specific direction from the second state. For example, the connector holder 500 may be rotated from the state in which it is moved to protrude towards the seating area 122a of the front case 122 further than in the peripheral area 122b so that the binder 510 faces the upper side (for example, towards the sky).

Figure 6A:
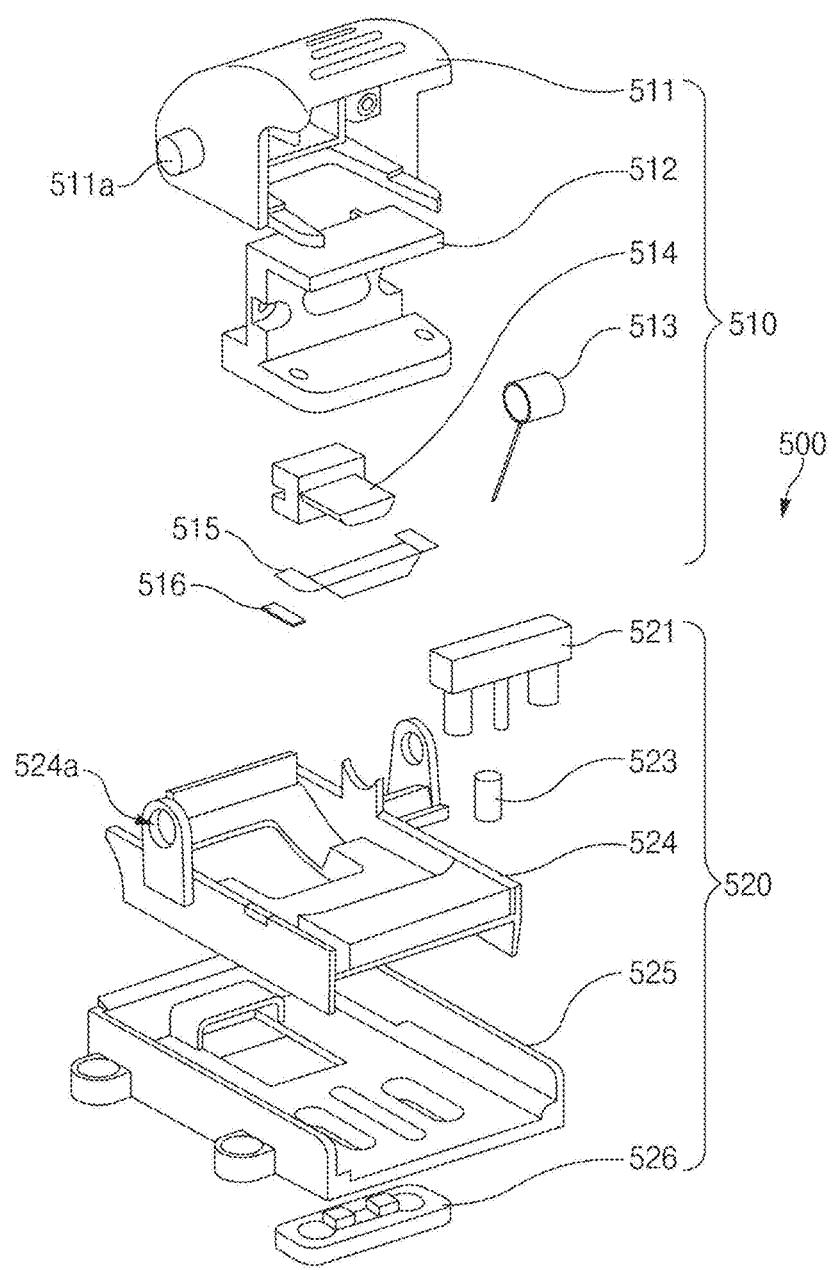
FIG. 6A is an exploded perspective view of a connector holder according to an embodiment of the present disclosure.

FIG. 6A is an exploded perspective view of a connector holder according to an embodiment of the present disclosure.

Referring to FIG. 6A, the connector holder 500 may include a binder 510 and a support member 520. The binder 510 may include a connecting device holder 511, a connecting cap 512, a first resilient member 513, a connector 514, an indicator 516, and a holder rubber 515. The support member 520 may include a slide button 521, a second resilient member 523, a connecting slider 524, a slider cap 525, and a slide support 526.

One side of the electronic device 200, for example, a lower end of the electronic device 200 in which an electrical connection support is arranged may be inserted into the binder 510. In the meantime, the connector 514 arranged inside the binder 510 may be inserted into a connection port arranged at a lower end of the electronic device 200. The support member 520 may allow the binder 510 to be horizontally moved while supporting the binder 510. The support member 520 may allow the binder 510 to be fixed at a specific location.

For example, as illustrated, the connecting device holder 511 may have a curved outer contour, and may have a C shape such that one side thereof surrounds a side wall of the electronic device 200. Further, the connecting device holder 511 may include at least one pin 511a connected to a ring 524a provided on one side of the connecting slider 524 on one side thereof such that the connecting device holder 511 is not separated from the connecting slider 524 while being rotated by a specific angle to be coupled to the connecting slider 524. At least a portion of an outer contour of the connecting device holder 511 may be textured such that a finger does not slip while the connecting device holder 511 is pressed after force is applied by the user.

The connecting cap 512 is seated inside the connecting device holder 511 and may include an area that substantially faces a side wall of the electronic device 200. The connecting cap 512 has a size that is smaller than that of the connecting device holder 511 and may be seated inside the connecting device holder 511. The connecting cap 512 may have a C shape to surround a portion of a side wall of the electronic device 200. Further, the connecting cap 512 may include at least one hole through which the holder rubber 515 protrudes through one side thereof.

The first resilient member 513 may provide a resilient force while the connector holder 500 is rotated to allow the connector holder 500 to return to an original state (for example, a first state or a second state). For example, the first resilient member 513 may be seated on and fixed to one side of the connecting slider 524 while coupled to any one of the at least one pin 511a of the connecting device holder 511. Accordingly, the first resilient member 513 is urged by a winding force while the connector holder 500 is rotated in a specific direction and if the external pressure is released, the first resilient member 513 may exert a resilient force such that the connector holder 500 returns to an original state. For example, the first resilient member 513 is urged while the connector holder 500 is rotated upwards from the bottom of the seating area 122a of the front case 122 to exert a resilient force such that the connector holder 500 returns to the bottom of the seating area 122a.

The connector 514 may be arranged to protrude to the inside of the connecting cap 512 through a hole formed on one side of the connecting cap 512. Although the drawing illustrates only the connector 514, the connector holder 500 may further include wiring lines (for example, a flexible printed circuit board (FPCB)) that are electrically coupled to the connector 514. The connector 514 may provide a path along which the HMD device 100 and the electronic device 200 transmit and receive signals there between.

The holder rubber 515 may be arranged such that at least a portion thereof protrudes to the inside of the connecting cap 512 through at least one hole provided in the connecting cap 512. The holder rubber 515, for example, may be formed of a rubber material or various materials having a specific tension. The holder rubber 515, for example, may function to restrain scratches that may be generated on a side surface (for example, a side area in which a connection port is arranged) of the electronic device 200 while the electronic device 200 is inserted.

The indicator 516 may be arranged on one side of the connecting slider 524. The indicator 516, for example, may include a structure printed with a specific color. As described above, at least a portion of the indicator 516 may be exposed to the outside through any one of a plurality of holes provided in the indication part 800 of the front case 122.

The slide button 521 may include a support part and at least one column. Each column, for example, may be horizontally movable through at least one rail hole provided in the slider cap 525. The second resilient member 523 may be arranged in at least one of the columns. Although the drawing exemplarily illustrates a form in which the second resilient member 523 is arranged a central one of the columns, various embodiments are not limited thereto. The slide button 521, for example, may be arranged in an area adjacent to the connecting slider 524. Ends of the columns of the slide button 521 may be coupled to the slide support 526.

The second resilient member 523 may be arranged to face a surface of the slider cap 525 while being coupled to at least one of the columns of the slide button 521. The second resilient member 523 may exert a resilient force such that the slide button 521 is pushed upwards while being compressed when the slide button 521 is pushed.

The connecting slider 524 may include a seating area 122a in which the holder rubber 515, the connecting cap 512, and the connecting device holder 511 are seated. According to various embodiments, a passage (or a hole) in which circuit wiring lines electrically connect to the connector 514 may be formed on one side of the connecting slider 524. One side of the connecting slider 524 may have a cover shape by which an upper end support of the slide button 521 is seated. The connecting slider 524 may include at least one ring 524a that is coupled to at least one pin 511a provided in the connecting device holder 511. A rail may be provided at a lower portion of the connecting slider 524 such that the connecting slider 524 may be horizontally movable along a rail groove provided in the slider cap 525.

The slider cap 525, for example, may include a seating part in which the connecting slider 524 is seated, a through-hole through which at least some of the columns of the slider button 521 pass, and a rail that supports horizontal movement of the connecting slider 524. According to various embodiments, coupling parts that protrude outward and may be coupled to the front case 122 by a coupling device (for example, a screw) may be provided on opposite side walls of the slider cap 525. At least one recess in which the slide support 526 is seated to be fixed may be arranged at a lower portion of the slider cap 525. According to an embodiment, a plurality of recesses may be arranged in an area of a lower portion of the slider cap 525, in which the slide support 526 is arranged such that the connecting slider 524 is prevented from being horizontally moved by a force applied only horizontally. For example, while the slider cap 525 and the slide support 526 are coupled to at least one of the plurality of recesses, the plurality of recesses may function as stopping elements that prevent horizontal movement of the connecting slider 524. Further, while the slide support 526 is moved vertically downward and is separated from the plurality of recesses, the plurality of recesses may allow the connecting slider 524 to be horizontally moved.

The slide support 526, for example, may include a hole that may be coupled to at least one column provided in the slide button 521. Further, the slide support 526 may be horizontally moved along a through-hole provided in the slider cap 525 while being coupled to the columns. According to an embodiment, the slide support 526 may include at least one protrusion that protrudes upwards (for example, towards the slider cap 525). The protrusion may be released from or coupled to the plurality of recesses provided on one side of the slider cap 525 by applying an external pressure or removing an external pressure applied vertically downwards (for example, towards the facial side of the main frame 110).

Figure 6B:
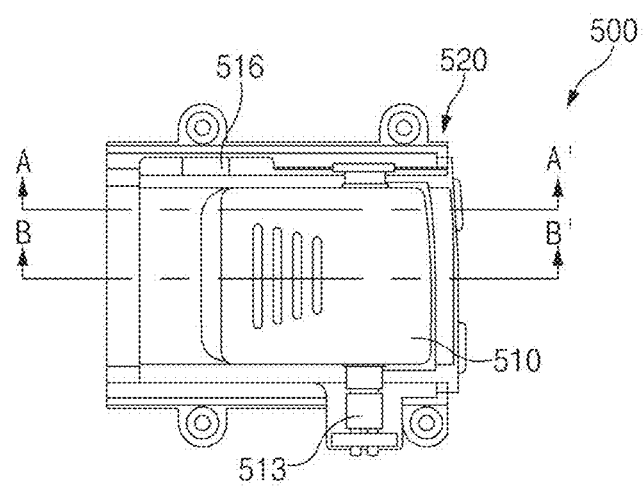
FIG. 6B is a view illustrating a connector holder in a first state according to an embodiment of the present disclosure.

FIG. 6B is a view illustrating a connector holder in a first state according to an embodiment of the present disclosure.

Referring to FIG. 6B, the connector holder 500 may include a binder 510 and a support member 520. The binder 510, for example, may be arranged to surround one side of the electronic device 200. The connector arranged in the binder 510 may be electrically connected to the electronic device 200. The binder 510 may exert a resilient force against a rotation in one direction while the first resilient member 513 is coupled to the connecting slider 524. Accordingly, after rotating the binder 510 upwards by a specific angle, the electronic device 200 may be inserted into the connector arranged in the binder 510 while the binder 510 is maintained to indicate an upward direction by applying a constant pressure. At least one textured protrusion (or a textured boss e.g., wrinkle boss) is arranged at an upper end of the binder 510 so that a frictional force against a finger of the user may be increased when the binder 510 is rotated or horizontally moved. As illustrated, the indicator 516 may be arranged on one side of the connecting slider 524. A location of the indicator 516 may be changed in response to the horizontal movement of the connecting slider 524.

Figure 6C:
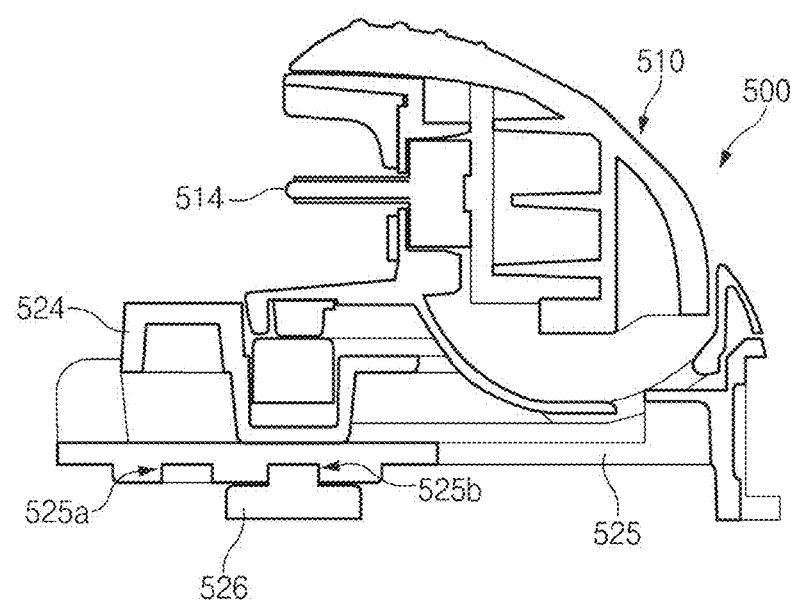
FIG. 6C is a view illustrating a first cutaway surface A-A' of a connector holder according to an embodiment of the present disclosure.

FIG. 6C is a view illustrating a first cutaway surface A-A' of a connector holder according to an embodiment of the present disclosure.

Figure 6D:
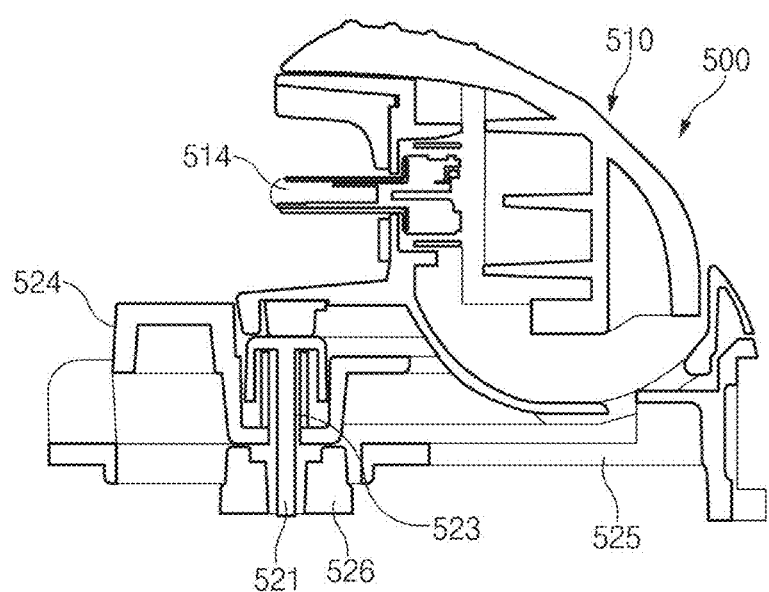
FIG. 6D is a view illustrating a second cutaway surface B-B' of a connector holder according to an embodiment of the present disclosure.

FIG. 6D is a view illustrating a second cutaway surface B-B' of a connector holder according to an embodiment of the present disclosure.

Referring to FIGS. 6C and 6D, in relation to the first state of the connector holder 500, the connector 514 may be arranged horizontally (for example, in a direction parallel to the bottom of the seating area 122a of the front case 122). In this state, the slide support 526 may be arranged at a first location of the lower end of the slider cap 525. A plurality of recesses, for example, a first recess 525a and a second recess 525b may be provided one side of a lower portion of the slider cap 525. The first recess 525a may be used, for example, when the slider cap 525 is coupled to a first type of electronic device, and the second recess 525b may be used, for example, when the slider cap 525 is coupled to a second type of electronic device. According to various embodiments, two or more recesses may be arranged at a lower portion of the slider cap 525 according to the type of the electronic device supported by the HMD device 100. Further, the interval and shape of the recesses arranged at a lower portion of the slider cap 525 may vary according to the types of the electronic devices supported by the HMD device 100.

The second resilient member 523 may be arranged between the slider cap 525 and the connecting slider 524 while being coupled to the columns of the slide button 521. In this state, if an external pressure is applied in a direction perpendicular to the direction in which the connector 514 is arranged, the second resilient member 523 may be urged downwards. While the second resilient member 523 is compressed, the slide support 526 connected to the column of the slide button 521 may be separated from the recess of the slider cap 525. In this state, if an external pressure is applied horizontally (for example, in a horizontal direction in which the connector 514 is arranged), the binder 510 may horizontally be moved.

If the external pressure is removed after the binder 510 is horizontally moved, the slide button 521 may return to the original position while the second resilient member 523 is restored. Accordingly, the slide support 526 connected to the slide button 521 may be coupled to a recess at a location that is different from the previous one.

Figure 6E:
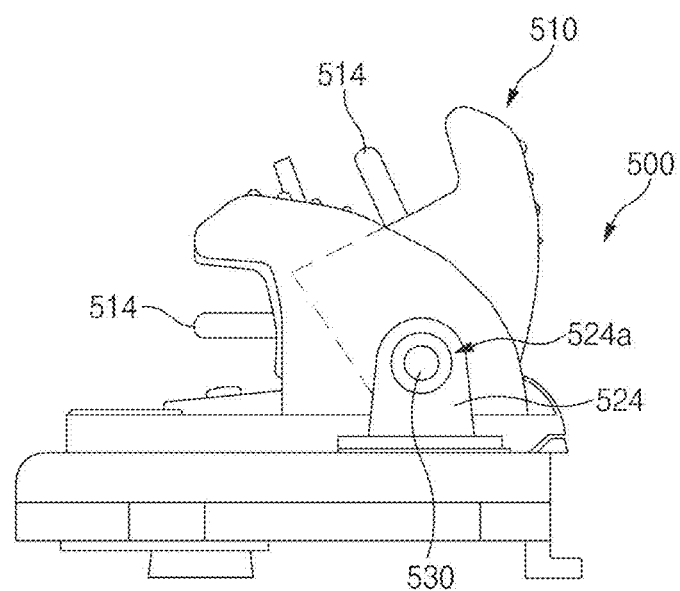
FIG. 6E is a view illustrating a movement state of a connector holder according to an embodiment of the present disclosure.

FIG. 6E is a view illustrating a movement state of a connector holder according to an embodiment of the present disclosure.

Referring to FIG. 6E, the connector holder 500 may be in a horizontal state and a rotation state as illustrated. In the horizontal state, the connector 514 of the connector holder 500 may be arranged parallel to the bottom of the seating area 122a of the front case 122. In the rotation state, the connector 514 may be arranged to indicate a direction that is inclined by a specific angle with respect to the bottom of the seating area 122a of the front case 122.

The connector holder 500 may be rotated through a rotary shaft 530. The aforementioned first resilient member 513 may be coupled to the rotary shaft 530. The rotary shaft 530 may be coupled to the ring 524a provided in the connecting slider 524. The connector holder 500 may be operated to return to the horizontal state by a resilient force of the first resilient member 513.

Figure 6F:
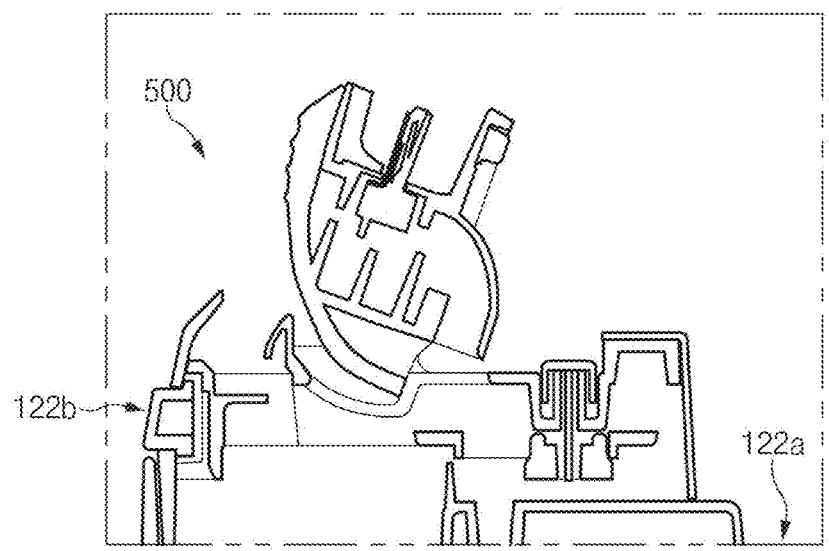
FIG. 6F is a view illustrating a cutaway surface of a connector holder in a third state according to an embodiment of the present disclosure.

FIG. 6F is a view illustrating a cutaway surface of a connector holder in a third state according to an embodiment of the present disclosure.

Referring to FIG. 6F, the connector holder 500 may be arranged to have a specific inclination from the bottom of the seating area 122a of the front case 122 while further protruding to the seating area 122a of the front case 122. According to an embodiment, in relation to a third state, the connector holder 500 may be in a third state while an external pressure of not less than a specific magnitude (for example, an external pressure of not less than a resilient force for restoring the first resilient member 513) is maintained.

In this regard, the connector holder 500 may be horizontally movable by a pressure applied vertically and horizontally. After being horizontally moved, the connector holder 500 may be arranged to be inclined towards the seating area 122a of the front case 122 (or arranged in the seating area 122a at a location that is spaced apart from the peripheral area 122b by a distance). Thereafter, if an external pressure is applied in a rotational direction (for example, an upward direction from the bottom of the seating area 122a of the front case 122 (or a curving direction toward the peripheral area 122b)), the connector holder 500 may be in the third state as illustrated. The third state, for example, may correspond to a location related to coupling of a first type (or second type) of electronic device. In this regard, as the indicator 516 of the connector holder 500 indicates a specific location of the indication part 800 (for example, a print area that represents the type of the electronic device), the user may determine a location of the connector holder 500 related to the type of the electronic device by identifying a location of the corresponding indicator 516 and the print area 820.

Figure 6G:
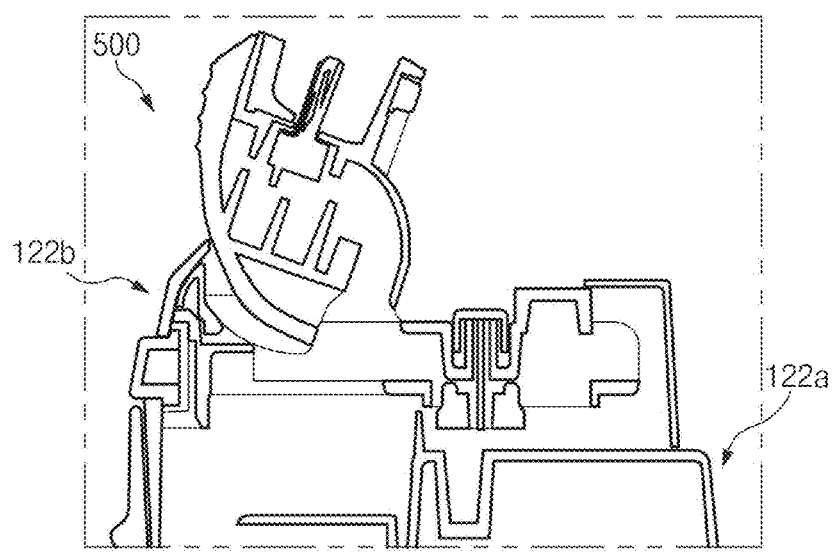
FIG. 6G is a view illustrating a cutaway surface of a connector holder in a fourth state according to an embodiment of the present disclosure.

FIG. 6G is a view illustrating a cutaway surface of a connector holder in a fourth state according to an embodiment of the present disclosure.

Referring to FIG. 6G, the connector holder 500 may be arranged to have a specific inclination from the bottom of the seating area 122a of the front case 122 in a state in which it is inclined towards the peripheral area 122b of the front case 122 (or a state in which it deviates from the seating area 122a). According to an embodiment, in relation to a fourth state, the connector holder 500 may be in a fourth state while an external pressure of not less than a specific magnitude (for example, an external pressure of not less than a resilient force for restoring the first resilient member 513) is maintained.

In this regard, the connector holder 500 may be moved horizontally (for example, from the seating area 122a towards the peripheral area 122b). After being horizontally moved, the connector holder 500 may be arranged to be inclined towards the peripheral area 122b of the front case 122. Thereafter, if an external pressure is applied in a rotational direction by a specific angle, the connector holder 500 may be in a fourth state as illustrated. The fourth state, for example, may correspond to a location related to coupling of a second type (or first type) of electronic device. In this regard, as a specific location (for example, a print area 820) of the indication part 800 (for example, a print area 820 that represents the type of the electronic device) is indicted as the indicator 516 is exposed at a location at which the connector holder 500 is arranged, the user may determine a location of the connector holder 500 related to the type of the electronic device by identifying a location of the corresponding indicator 516 and the print area 820.

Figure 6H:
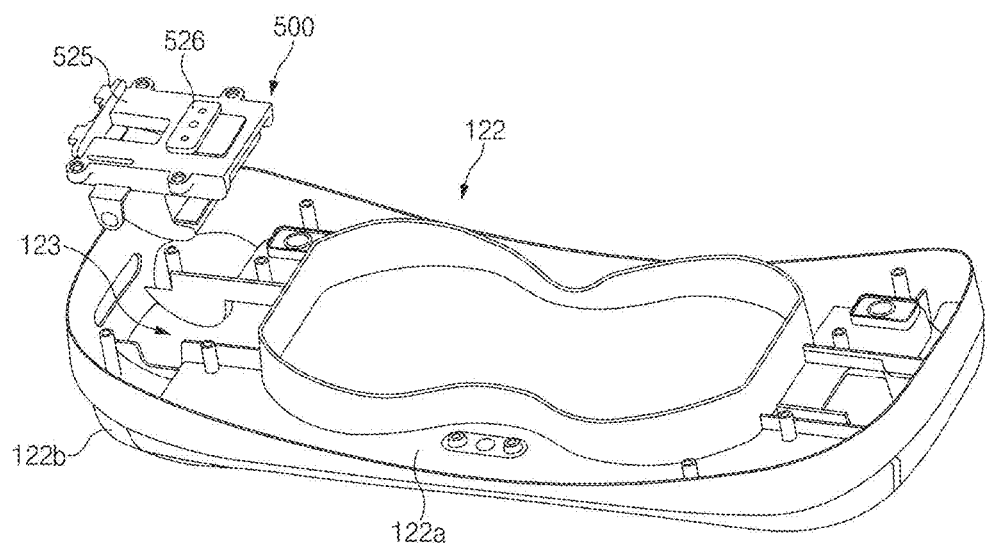
FIG. 6H is an exploded perspective view of a connector holder and a front case according to an embodiment of the present disclosure.

FIG. 6H is an exploded perspective view of a connector holder and a front case according to an embodiment of the present disclosure.

Referring to FIG. 6H, the connector holder 500 may be inserted from the rear surface of the front case 122 towards the front surface of the front case 122 to be fixed. In this regard, the front case 122 may include a connector holder hole 123 such that at least a portion of the connector holder 500 is exposed to the front side. The binder 510 of the connector holder 500 may be arranged to protrude from a peripheral portion of one side of the front case 122 through the connector holder hole 123. According to various embodiments, after the connector holder 500 is mounted in the connector holder hole 123, the connector holder 500 may be fixed to the connector holder hole 123 through a coupling device (for example, a hook or screw).

As illustrated, the connector holder 500 may include a slider cap 525 that has a rear surface coupled to any one of the recesses provided in the slide support 526. In the coupling process, an area in which the first resilient member 513 of the connector holder 500 is arranged may be covered by the peripheral area 122b of the front case 122.

Figure 7A:
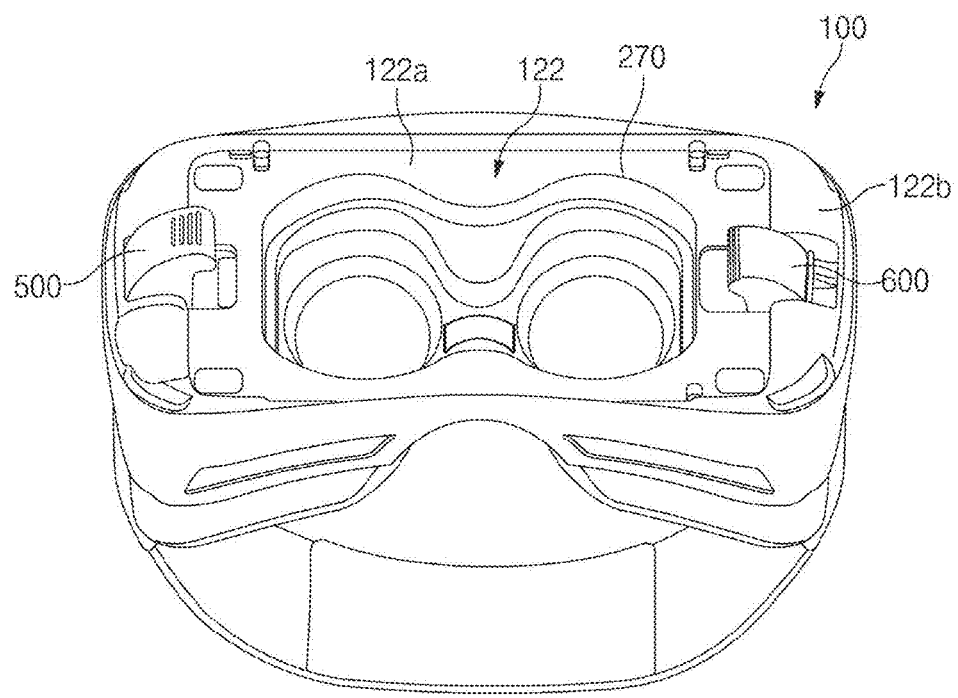
FIG. 7A is a view illustrating a fixing holder of a front case of the HMD device in a first state according to an embodiment of the present disclosure.

FIG. 7A is a view illustrating a fixing holder of a front case of the HMD device in a first state according to an embodiment of the present disclosure.

Referring to FIG. 7A, in the HMD device 100, the lens hole 270 may be arranged at the center of the seating area 122a of the front case 122, and the connector holder 500 and the fixing holder 600 may be arranged at peripheral portions of the lens hole 270. The fixing holder 600, for example, may be horizontally movable towards a central portion of the seating area 122a of the front case 122 or from the seating area 122a of the front case 122 towards the peripheral area 122b. According to an embodiment, as illustrated, when a separate external pressure is not applied, the fixing holder 600 may be in a first state in which it is inclined towards the seating area 122a. Although it is illustrated in the drawing that the connector holder 500 is inclined towards the peripheral area 122b, the connector holder 500 may be horizontally moved by a pressure applied vertically and horizontally as described above.

Figure 7B:
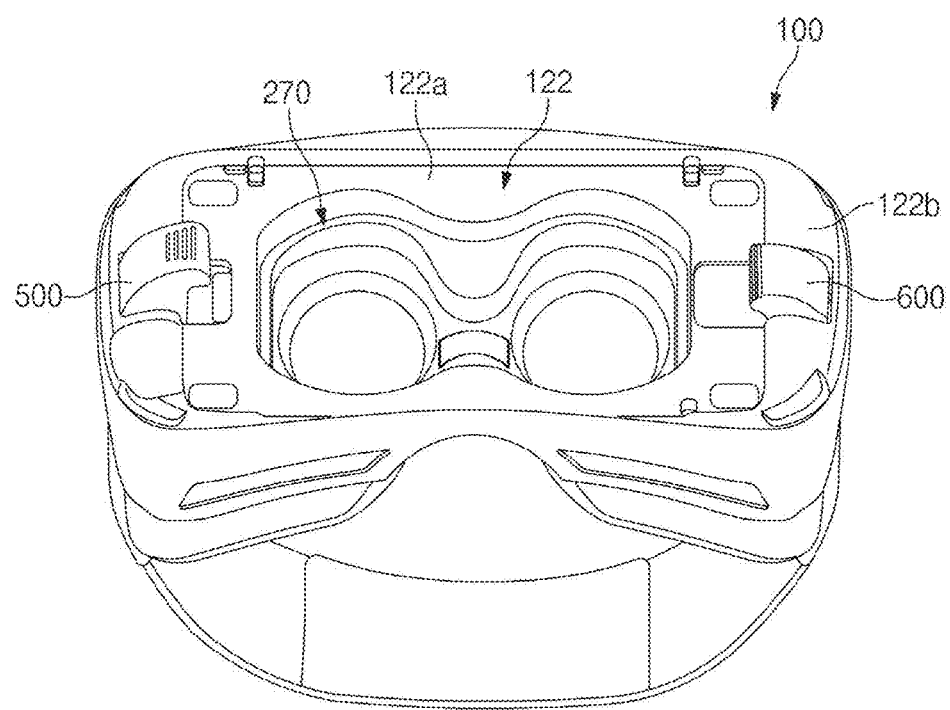
FIG. 7B is a view illustrating the fixing holder of the front case of the HMD device in a second state according to an embodiment of the present disclosure.

FIG. 7B is a view illustrating the fixing holder of the front case of the HMD device in a second state according to an embodiment of the present disclosure.

Referring to FIG. 7B, the HMD device 100 may include a connector holder 500 and a fixing holder 600 that are arranged around the seating area 122a in which a lens hole 270 is arranged. The fixing holder 600, for example, may be horizontally movable in a direction farther from the central portion of the seating area 122a of the front case 122 (or towards the peripheral area 122b). According to an embodiment, when an external pressure of not less than a magnitude is applied horizontally with respect to the bottom of the seating area 122a of the case 122, the fixing holder 600 may be in a second state in which it is inclined in a direction in which it moves farther from the seating area 122a or towards the peripheral area 122b as illustrated. The second state may be maintained while the external pressure is maintained. If the external pressure is released, the fixing holder 600, for example, may be horizontally movable towards a central portion of the seating area 122a of the front case 122. Although it is illustrated in the drawing that the connector holder 500 is inclined towards the peripheral area 122b, the connector holder 500 may be horizontally moved by a pressure applied vertically and horizontally.

Figure 7C:
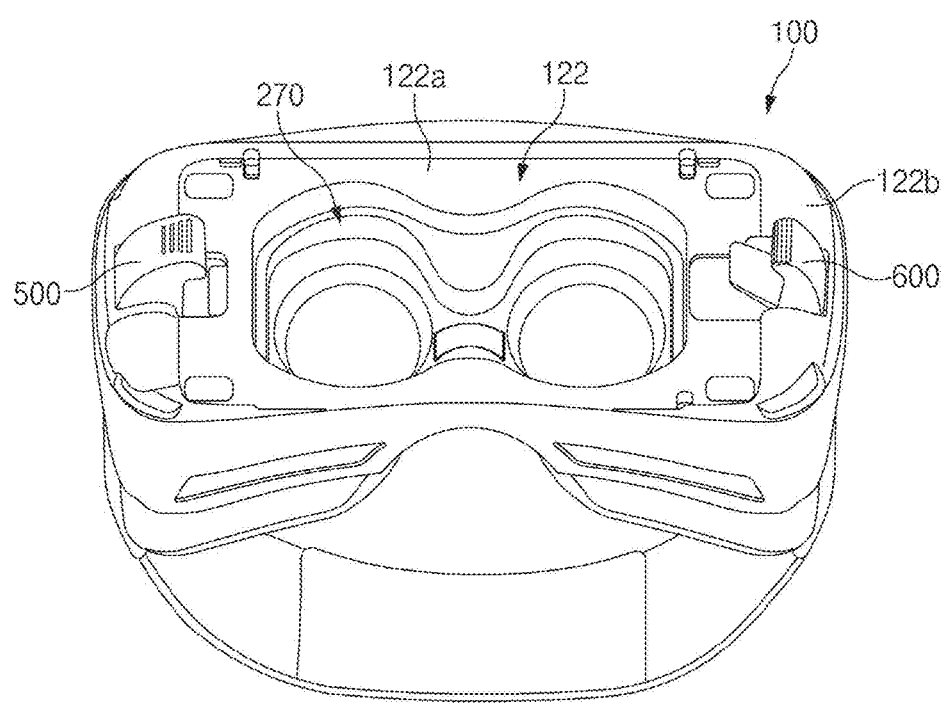
FIG. 7C is a view illustrating the fixing holder of the front case of the HMD device in a third state according to an embodiment of the present disclosure.

FIG. 7C is a view illustrating the fixing holder of the front case of the HMD device in a third state according to an embodiment of the present disclosure.

Referring to FIG. 7C, the HMD device 100 according to an embodiment may include a connector holder 500 and a fixing holder 600 that are arranged around the seating area 122a in which a lens hole 270 is arranged. The fixing holder 600, for example, may be horizontally moved in a direction farther from the central portion of the seating area 122a of the front case 122 (or towards the peripheral area 122b). While the fixing holder 600 is horizontally moved towards the peripheral area 122b, a resilient force of the resilient member arranged in the fixing holder 600 may increase.

According to an embodiment, when an external pressure of not less than a magnitude is horizontally provided with respect to the bottom of the seating area 122a of the front case 122 such that the second state described with reference to FIG. 7B is established and then an external pressure of not less than a magnitude is additionally applied, the fixing holder 600 may be rotated to a specific inclination with the bottom of the seating area 122a of the front case 122 at a location in the second state. Accordingly, as illustrated, the fixing holder 600 may be parallel to the bottom of the seating area 122a of the front case 122 and then may be in a third state in which it is inclined at a specific inclination from the bottom of the seating area 122a as it rotates. According to various embodiments, when a separate external pressure (for example, a force applied from the peripheral area 122b of the front case 122 towards a central portion of the seating area 122a) is not provided, the third state may be maintained. In this regard, the third state may be maintained by coupling the fixing holder 600 to a stopping element arranged in the peripheral area 122b such that the fixing holder 600 may resist against a resilient force of the resilient member. The connector holder 500 may be horizontally moved by a pressure applied vertically and horizontally.

Figure 8A:
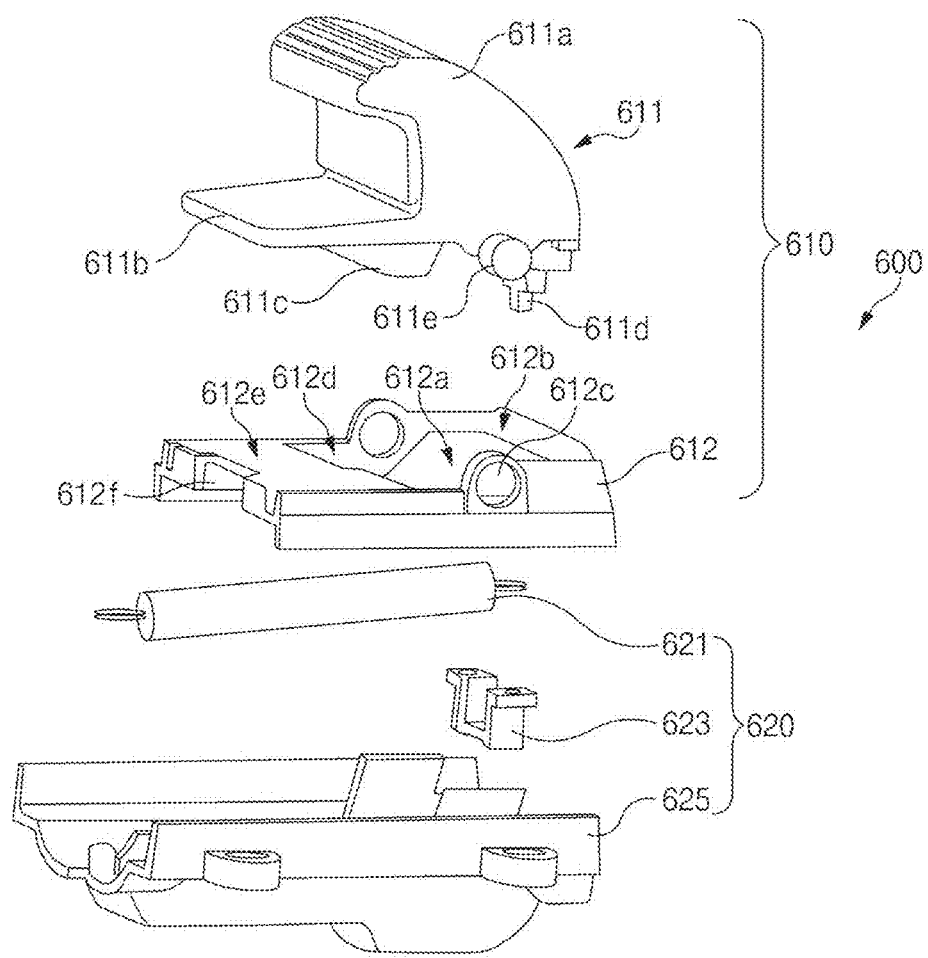
FIG. 8A is an exploded perspective view of a fixing holder according to an embodiment of the present disclosure.

FIG. 8A is an exploded perspective view of a fixing holder according to an embodiment of the present disclosure.

Referring to FIG. 8A, the fixing holder 600 may include a holder part 610 and a support part 620. The holder part 610 may include a fixing part body 611 and a fixing part slider 612. The support part 620 may include a third resilient member 621, a holder cap 623, and a fixing part support 625.

The fixing part body 611, for example, may include a curved part 611a that forms a curved surface in a specific angle range as a whole while an outer contour has a specific width, a support bar 611b that extends from a lower end of the curved part 611a in the first direction (for example, towards the seating area 122a of the front case 122) while having a specific width, a stopping element 611c that extends from a lower side of the support bar 611b in the second direction (for example, a direction perpendicular to the bottom surface of the support bar 611b), a protrusion 611d that protrudes from a lower end of the curved part 611a in the second direction (for example, vertically downwards or towards the facial side of the front case 122), and a connecting shaft 611e arranged on a side surface of the curved part 611a.

One side of the curved part 611a, for example, an upper end of the curved part 611a may be rounded. Further, a texture may be formed on at least a portion of the surface of the curved part 611a. According to various embodiments, an upper end of the curved part 611a may include an area that has a hangover shape and protrudes in the first direction. Accordingly, the overall shape of the curved part 611a may have a hook shape.

The support bar 611b, for example, may have a shape a thickness of which gradually decreases as it goes in the first direction. The support bar 611b, for example, may be an area that faces a portion of a side surface of the electronic device 200 while the electronic device 200 is seated in the HMD device 100. As the support bar 611b protrudes in the first direction, the fixing holder 600 may have a C shape as a whole. Further, the fixing holder 600 has a C shape as a whole, and a protrusion at an upper end thereof may be shorter than a protrusion at a lower end thereof. Based this, the electronic device 200 avoids collision with the curved part 611a while facing the support bar 611b. The stopping element 611c may be arranged below the support bar 611b. The stopping element 611c may be arranged to be stopped by a depression or opening provided in the fixing part slider 612.

The protrusion 611d may protrude downward from a distal lower end of the curved part 611a, which is opposite to the first direction (or towards the facial side of the front case 122 to which the fixing holder 600 is coupled). The protrusion 611d may be multi-stepped such that steps having different thicknesses and widths are connected to each other. One side of the protrusion 611d (for example, a first step on the lower side of the drawing), for example, may be connected to one end of the third resilient member 621, and an opposite side of the protrusion 611d (a second step situated on the first step in the drawing) may be coupled to the holder cap 623. The protrusion 611d, for example, may function to fix one side of the third resilient member 621 to the fixing part body 611.

The connecting shaft 611e, for example, may extend by a specific thickness in a depth direction (or a direction in which it protrudes upwards from a surface of a side wall of the curved part 611a) with respect to a side wall of the curved part 611a. The connecting shaft 611e may be coupled to a connection hole 612c provided in the fixing part slider 612 to support a hinge motion (or a rotation within a specific angle range) of the fixing holder 600.

The fixing part slider 612 may include an opening or depression 612a in which the fixing part body 611 is seated, side walls 612b that surround the opening or depression 612a, connection holes 612c that are formed on sides of the side walls 612b to be coupled to the connecting shaft 611e, a first seating part 612d in which the stopping element 611c is seated, and a second seating part 612e in which the support bar 611b is seated. A plurality of connection holes 612c, for example, may be arranged. The first seating part 612d may be arranged inside the second seating part 612e. The first seating part 612d may be lower than the second seating part 612e with respect to the bottom of the fixing part slider 612. Accordingly, a step may be formed between the first seating part 612d and the second seating part 612e. According to various embodiments, a recess 612f in which the third resilient member 621 is arranged may be provided at a front end of the fixing part slider 612 (for example, a front end of the second seating part 612e).

One side of the third resilient member 621 may be coupled to one side of the fixing part body 611 (for example, the protrusion 611d) seated in the fixing part slider 612. Further, an opposite side of the third resilient member 621 may be coupled to a recess formed in the fixing part support 625. At least a portion of the third resilient member 621, for example, may include a spring shape that exerts a resilient force horizontally. Accordingly, a resilient force of the third resilient member 621 may increase while the fixing part body 611 and the fixing part slider 612 are moved horizontally (for example, towards the peripheral area 122b of the front case 122) based on the fixing part support 625 so that a resilient force is exerted such that the fixing part body 611 and the fixing part slider 612 are moved towards the seating area 122a of the front case 122. The third resilient member 621, for example, may include a ring that is coupled to the protrusion 611d and a ring that is coupled to the recess that is formed in the fixing part support 625.

The holder cap 623 may function to fix the third resilient member 621 such that one side of the third resilient member 621 is not separated after being coupled to the protrusion 611d. The holder cap 623, for example, may have a U shape. The holder cap 623, for example, may include a ring in which one side of the third resilient member 621 is seated and a coupling part that is coupled to the protrusion 611d.

The fixing part support 625 may include a ring in which one side of the third resilient member 621 is seated to be fixed. Further, the fixing part support 625 may include a rail groove such that the fixing part slider 612 is horizontally moved. A rail provided on the bottom of the fixing part slider 612 may be seated in the rail groove. Further, a coupling structure for fixing the fixing part support 625 may be arranged on one side of the fixing part support 625 (a side wall of the fixing part support 625). The coupling structure, for example, may be configured to fix one side of the front case 122 and the fixing part support 625 through a hook or a screw.

Figure 8B:
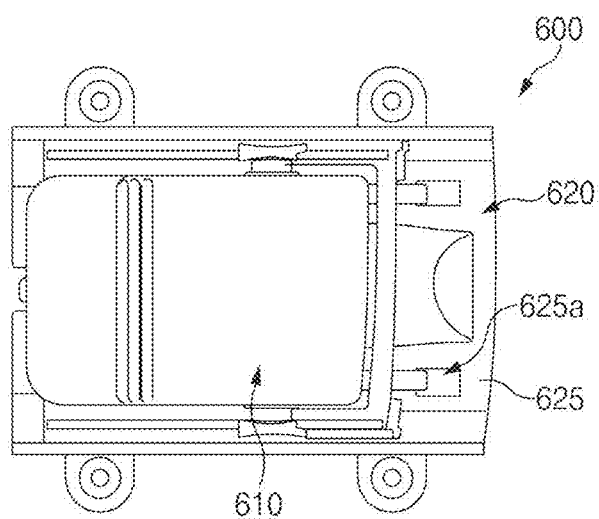
FIG. 8B is a view illustrating a first state of a fixing holder according to an embodiment of the present disclosure.

FIG. 8B is a view illustrating a first state of a fixing holder according to an embodiment of the present disclosure.

Figure 8C:
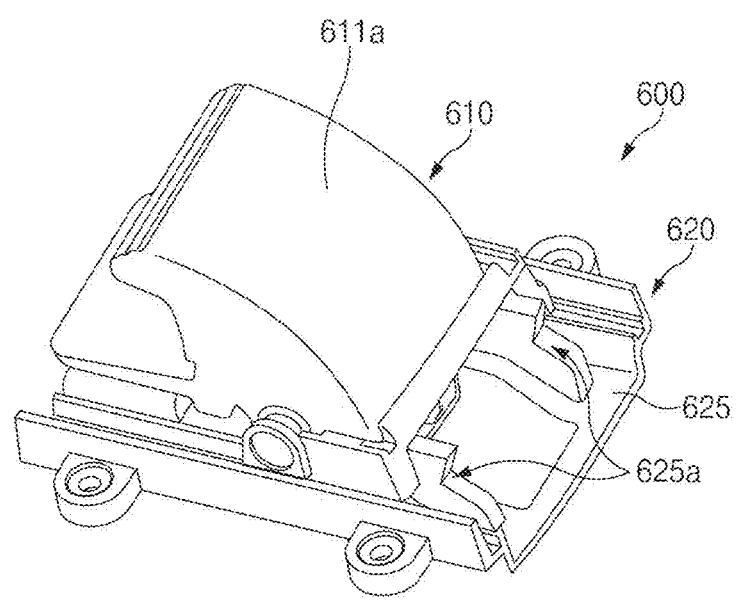
FIG. 8C is a perspective view illustrating a fixing holder in a first state according to an embodiment of the present disclosure.

FIG. 8C is a perspective view illustrating a fixing holder in a first state according to an embodiment of the present disclosure.

Referring to FIGS. 8B and 8C, the fixing holder 600, for example, is moved horizontally while the holder part 610 is positioned on the support part 620. According to an embodiment, as described above, the third resilient member 621 arranged in the support part 620 may exert a resilient force in a direction in which the location of the holder part 610 is restored when the holder part 610 is moved in one direction, while connecting the holder part 610 and the fixing part support 625. The first state of the illustrated fixing holder 600 may correspond to a state in which the third resilient member 621 is contracted. Accordingly, the holder part 610 may be inclined towards the seating area 122*a* of the front case 122.

According to various embodiments, a hook 625*a* that is temporarily coupled to a lower end of the fixing part body 611 (or the curved part 611*a*) of the holder part 610 may be arranged on one side of the fixing part support 625 of the support part 620. The hook 625*a*, for example, may be coupled to the holder part 610 while the holder part 610 is rotated to a specific inclination after being moved towards a periphery of the support part 620. The hook 625*a*, for example, may have a triangular recess as a portion of a side wall of the hook 625*a* is cutaway inwards.

Figure 8D:
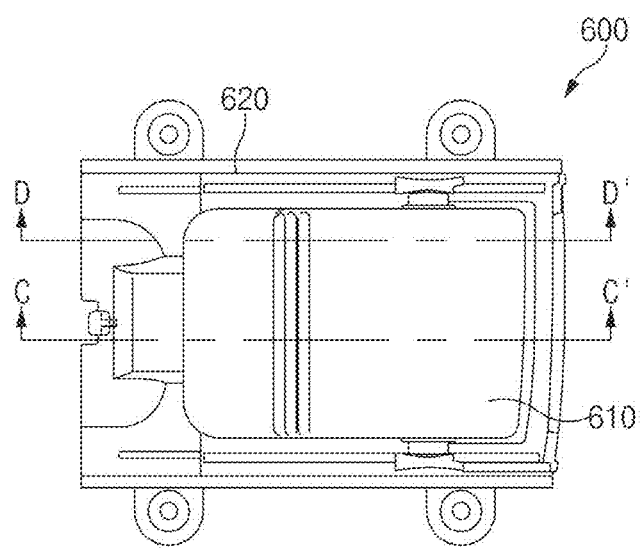
FIG. 8D is a view illustrating a fixing holder in a second state according to an embodiment of the present disclosure.

FIG. 8D is a view illustrating a fixing holder in a second state according to an embodiment of the present disclosure.

Referring to FIG. 8D, for example, if an external pressure is applied to one side of the fixing holder 600, the holder part 610 of the fixing holder 600 may be inclined towards the peripheral area 122*b* as illustrated. According to an embodiment, when a pressing object in contact with a portion of an upper end of the holder part 610 applies a force from a central portion of the seating area 122*a* of the front case 122 towards the peripheral area 122*b*, the holder part 610 may be horizontally moved rearwards (for example, towards the peripheral area 122*b*) along the rail of the support part 620.

In the above-described state, a resilient force of the third resilient member 621 may increase as it is extended by a specific length. If the external pressure by which the holder part 610 is moved towards the peripheral area 122*b* is released, the holder part 610 may return to the state of FIG. 8B.

Figure 8E:
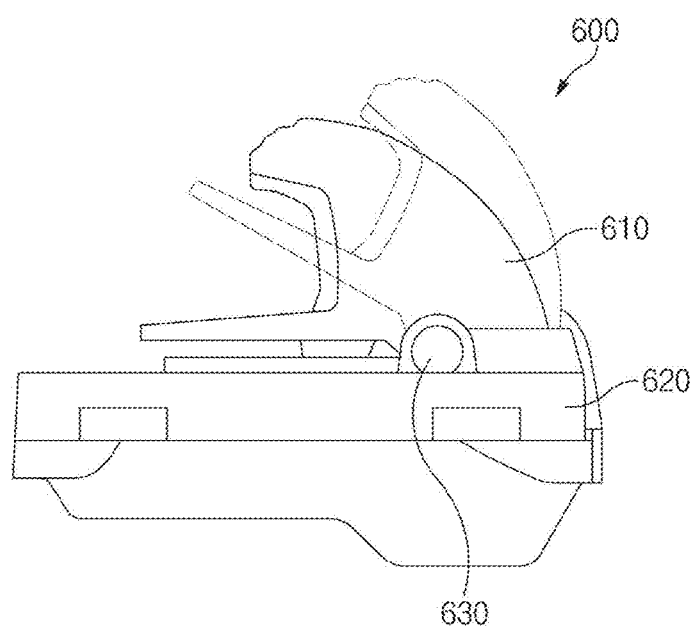
FIG. 8E is a view illustrating a movement state of a fixing holder according to an embodiment of the present disclosure.

FIG. 8E is a view illustrating a movement state of a fixing holder according to an embodiment of the present disclosure.

Referring to FIG. 8E, the fixing holder 600 may be rotated within an angle in a direction with respect to the fixing shaft 630. For example, while the holder part 610 of the fixing holder 600 is moved to the location described in FIG. 8D, the holder part 610 of the fixing holder 600 may be rotated while being inclined with respect to the bottom of the front case 122. When the holder part 610 is rotated, the holder part 610 may maintain a rotation state even though a separate external pressure is not applied while one side of the holder part 610 (for example, one side of the fixing part body 611) is coupled to the hook 625*a*. As the holder part 610 is rotated, the bottom of the seating area 122*a* of the front case 122 may be inclined at a specific upward inclination while the support bar 611*b* is horizontally positioned.

According to various embodiments, if the external pressure is released or the coupling state of the hook 625*a* and the holder part 610 is released, the holder part 610 may automatically return to the first state. Further, if an external pressure towards the peripheral area 122*b* is maintained while an external pressure for releasing the coupling state of the hook 625*a* and the holder part 610 is applied, the holder part 610 may be in the second state (for example, a state in which the holder part 610 is inclined towards the peripheral area 122*b*).

Figure 8F:
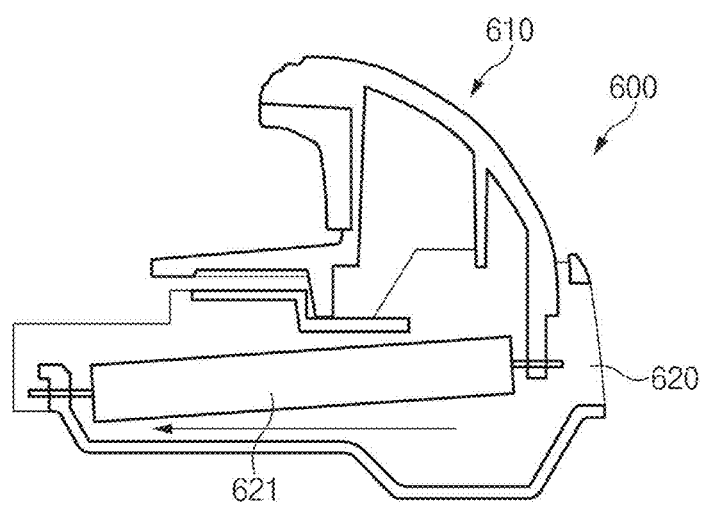
FIG. 8F is a view illustrating a first cutaway surface C-C' of a connector holder in a second state according to an embodiment of the present disclosure.

FIG. 8F is a view illustrating a first cutaway surface C-C' of a connector holder in a second state according to an embodiment of the present disclosure.

Referring to FIG. 8F, the fixing holder 600 may include a holder part 610 and a support part 620. When the external pressure applied to the holder part 610 is applied towards the peripheral area 122*b* of the front case 122, the holder part 610 may be moved towards the peripheral area 122*b*. In this case, the third resilient member 621 may have an increased resilient force while being extended as compared with the initial state. If the external pressure is released in this state, the holder part 610 may return to the previous state (for example, the state of the holder part 610 of FIG. 8B).

Figure 8G:
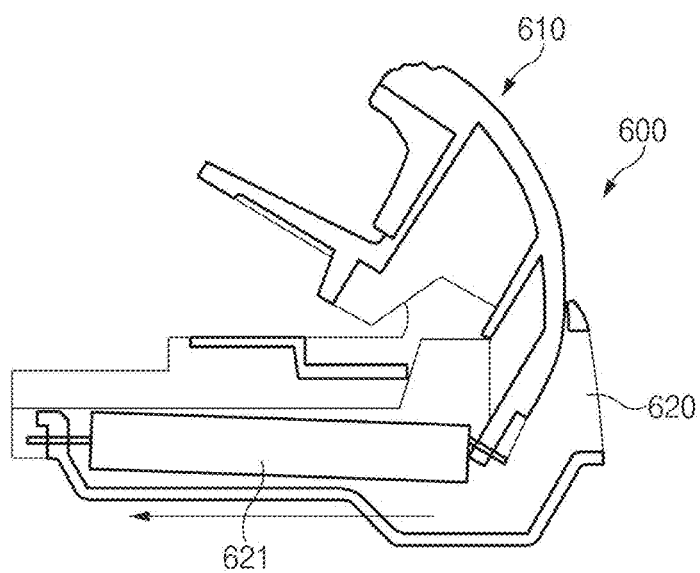
FIG. 8G is a view illustrating a first cutaway surface A-A' of a connector holder in a third state according to an embodiment of the present disclosure.

FIG. 8G is a view illustrating a first cutaway surface C-C' of a connector holder in a third state according to an embodiment of the present disclosure.

Figure 8H:
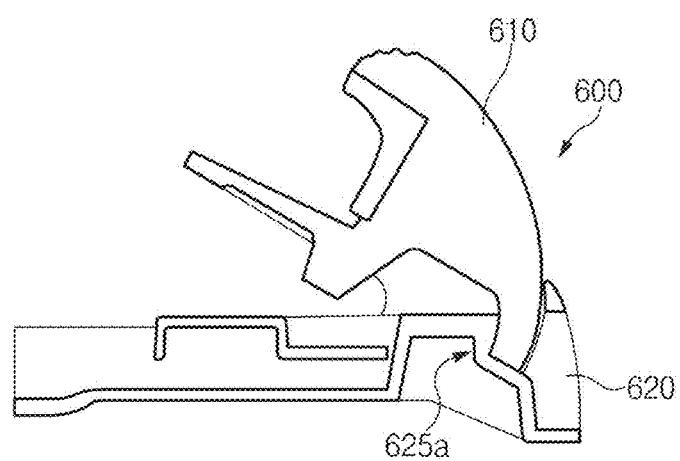
FIG. 8H is a view illustrating a second cutaway surface D-D' of a connector holder in a third state according to an embodiment of the present disclosure.
Figure 81:
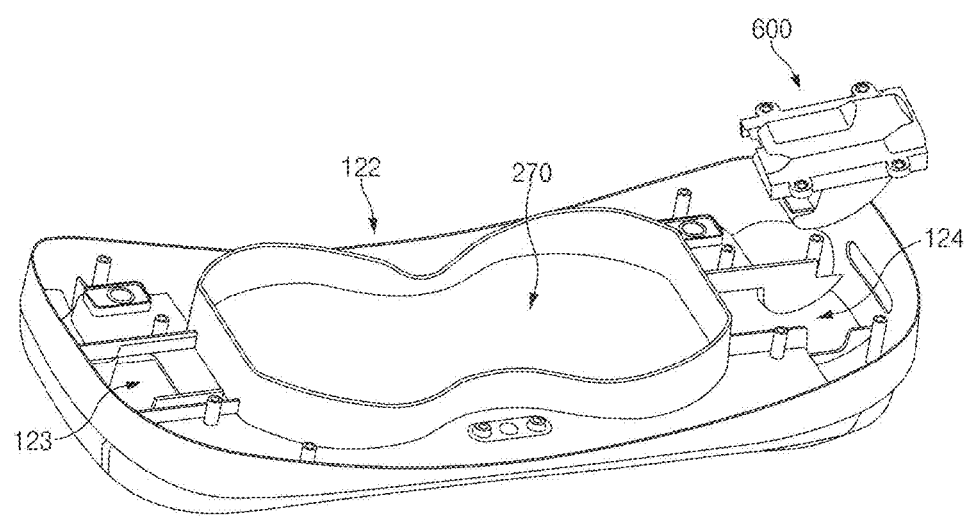

FIG. 8H is a view illustrating a second cutaway surface D-D' of a connector holder in a third state according to an embodiment of the present disclosure.

Referring to FIGS. 8G and 8H, the fixing holder 600 may include a holder part 610 and a support part 620. If the external pressure applied to the holder part 610 is further increased towards the peripheral area 122*b* of the front case 122 or an external pressure in a curved form that is deflected towards the facial side of the front case 122 is generated, the holder part 610 may be inclined at a specific inclination as illustrated. In this state, even though one side of a lower end of the holder part 610 is coupled to the hook 625*a* and a separate external pressure is not applied, the holder part 610 may maintain the third state (for example, an inclined state). In this operation, a resilient force may be exerted towards a central portion of the seating area 122*a* of the front case 122 while the third resilient member 621 is extended as compared with the initial state. According to various embodiments, the holder part 610 may maintain the third state even though the resilient force is exerted while the holder part 610 is coupled to the hook 625*a*. According to various embodiments, when a force is applied to the holder part 610 towards a central portion of the seating area 122*a* of the front case 122, the holder part 610 may return to the first state of FIG. 8B by the resilient force of the third resilient member 621. The force, for example, may include a force applied such that a lower end of the holder part 610 is separated from the hook 625*a*.

FIG. 8I is an exploded perspective view of a fixing holder and a front case according to an embodiment of the present disclosure.

Referring to FIG. 8I, the front case 122 may include a lens hole 270 in which a lens is arranged, a connector holder hole 123 in which the connector holder 500 is arranged, and a fixing holder hole 124 in which the fixing holder 600 is seated. The connector holder hole 123 and the fixing holder hole 124 may be arranged at locations that are symmetrical to each other with respect to the lens hole 270.

The fixing holder hole 124, for example, may correspond to the size of the fixing holder 600. According to an embodiment, a structure that is coupled to the coupling structure arranged in the fixing holder 600 may be arranged at a peripheral portion of the fixing holder hole 124. For example, at least one boss for screw coupling may be arranged in the front case 122 around the fixing holder hole 124.

As illustrated, the rear surface of the fixing holder 600 may include a space such that the third resilient member 621 may be extended and compressed. Further, an interior space that is larger than the seating area 122*a* may be provided on a side of the fixing holder 600, which is close to the peripheral area 122*b*, to be operated in the third state. Accordingly, a part of the fixing holder 600, which is close to the peripheral area 122*b*, may protrude further than a part of the fixing holder 600, which is close to the seating area 122*a*.

According to various embodiments, a head mounted display device may include a main frame which includes a lens, and a front case including a seating area in which an electronic device is seated, and a peripheral area that surrounds at least a portion of a periphery of the electronic device, and may further include at least one of a connector holder that is horizontally moved from one side of the peripheral area with respect to a bottom of the seating area of the front case and that is electrically connected to a connection port of the electronic device while surrounding at least a portion of one side of the electronic device when the electronic device is mounted, and a fixing holder that is horizontally moved from one side of the peripheral area with respect to the bottom of the seating area of the front case and that surrounds a portion of an opposite side surface of the electronic device when the electronic device is mounted.

According to various embodiments, the connector holder may include a binder that is horizontally moved by an external pressure while being electrically connected to the electronic device and a support member that guides a horizontal movement of the binder.

According to various embodiments, the binder may include a first resilient member that is responsible for restoration of rotation in a first direction with respect to the bottom of the seating area of the front case.

According to various embodiments, the support member may be horizontally moved by a second external pressure applied horizontally after being pressed by a first external pressure applied from the first direction to a second direction.

According to various embodiments, the support member may include a second resilient member that is responsible for restoration of the state in which the support member is pressed by the first external pressure, a slide button that is coupled to the second resilient member, a slide support that is coupled to the slide button and that has a protrusion, a slide cap that has at least one recess that is coupled to or separated from the protrusion of the slide support according to presence of the first external pressure and a connecting slider in which the binder is seated and that is horizontally moved on the slide cap by the second external pressure.

According to various embodiments, the head mounted display device may include a plurality of exposure holes that are provided on one side of the seating area of the front case to expose at least a portion of the connector holder and a plurality of print areas that are arranged adjacent to the plurality of exposure holes.

According to various embodiments, the head mounted display device may include an indicator provided on one side of the support member to be exposed through any one of the plurality of exposure holes while a portion of the support member is moved.

According to various embodiments, the fixing holder may include a holder part that is coupled to at least a portion of a side surface of the electronic device and a support that supports horizontal movement and rotation of the holder part.

According to various embodiments, the head mounted display device may include a third resilient member that provides a resilient force responsible for restoration of the holder part while the holder part is moved in a direction by an external pressure.

According to various embodiments, the holder part may include a fixing part body that has a semicircular form that surrounds one side of a side surface of the electronic device and in which a protruding length of an area that surrounds a first side surface of the electronic device is shorter than a protruding length of an area that surrounds a second side surface of the electronic device.

According to various embodiments, the fixing part body may include a support bar that surrounds the second side surface of the electronic device and a stopping element that is arranged below the support bar to restrain a movement distance of the holder part in the first direction.

According to various embodiments, the head mounted display device may include a hook that is coupled to one side of the holder part to be fixed after the holder part is rotated from a state in which the holder part is moved by a designated length or more.

A coupler according to various embodiments includes a front case that has a seating area in which the electronic device is seated, and a peripheral area that surrounds a periphery of the electronic device, and the front case includes a connector holder configured to be horizontally moved from one side of the peripheral area with respect to a bottom of the seating area of the front case and electrically connected to a connection port of the electronic device while surrounding at least a portion of a side surface of one side of the electronic device when the electronic device is mounted, and a fixing holder that is horizontally moved from one side of the peripheral area with respect to the bottom of the seating area of the front case and that surrounds a portion of an opposite side surface of the electronic device when the electronic device is mounted.

Figure 9A:
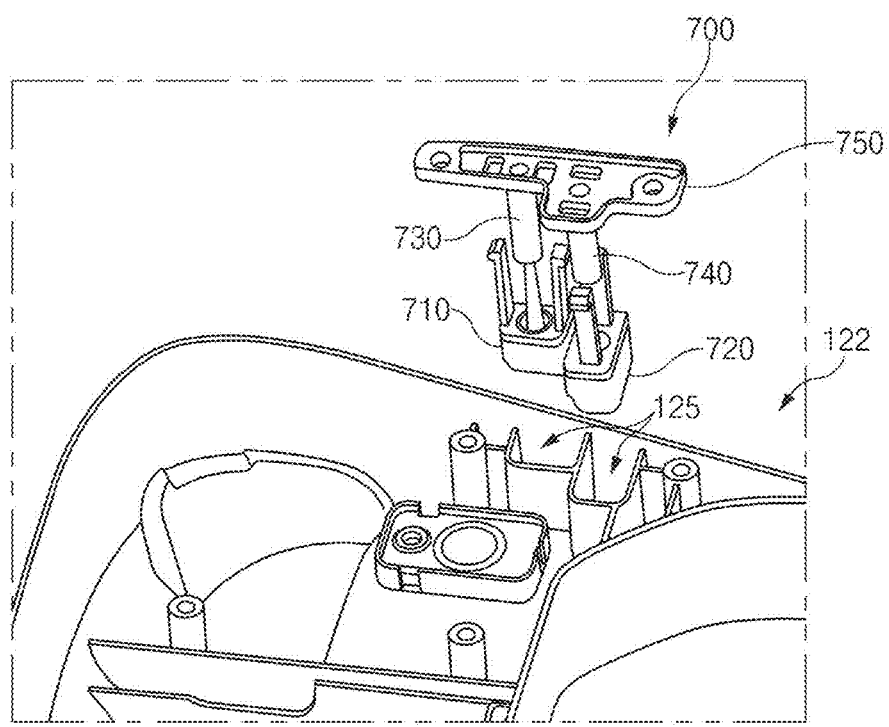
FIG. 9A is an exploded perspective view of a side wall protector according to an embodiment of the present disclosure.

FIG. 9A is an exploded perspective view of a side wall protector according to an embodiment of the present disclosure.

Referring to FIG. 9A, as described above, the HMD device 100 may include a plurality of device side wall protecting part 700 to protect side walls of various types of electronic devices. For example, the device side wall protecting part 700 may include a first side wall protector 710 and a second side wall protector 720 that protect side walls of a first type of electronic device. At least one of the first side wall protector 710 and the second side wall protector 720, for example, may be formed of a material (for example, a rubber material or a fiber material) having a specific tension. Further, the remaining one of the first side wall protector 710 and the second side wall protector 720 may be formed of a material (for example, plastic, glass, or wood) having a specific rigidity (or strength) to support the part having a tension.

According to various embodiments, the device side wall protecting part 700 may include a first resilient part 730 that is coupled to the first side wall protector 710, a second resilient part 740 that is coupled to the second side wall protector 720, and a resilient support part 750 that fixes the first resilient part 730 and the second resilient part 740. The resilient support part 750, for example, may include cylindrical bosses of a spring form in which the first resilient part 730 and the second resilient part 740 are seated to be fixed, and the cylindrical bosses may be configured such that a column included in the first side wall protector 710 and a column included in the second side wall protector 720 may be vertically moved while passing through the cylindrical bosses.

Insertion holes 125 into which the device side wall protecting part 700 is inserted may be arranged at a lower end of the front case 122. A boss coupled to the resilient support part 750 may be arranged in an area around the front case 122 in which the insertion holes 125 are arranged.

Figure 9B:
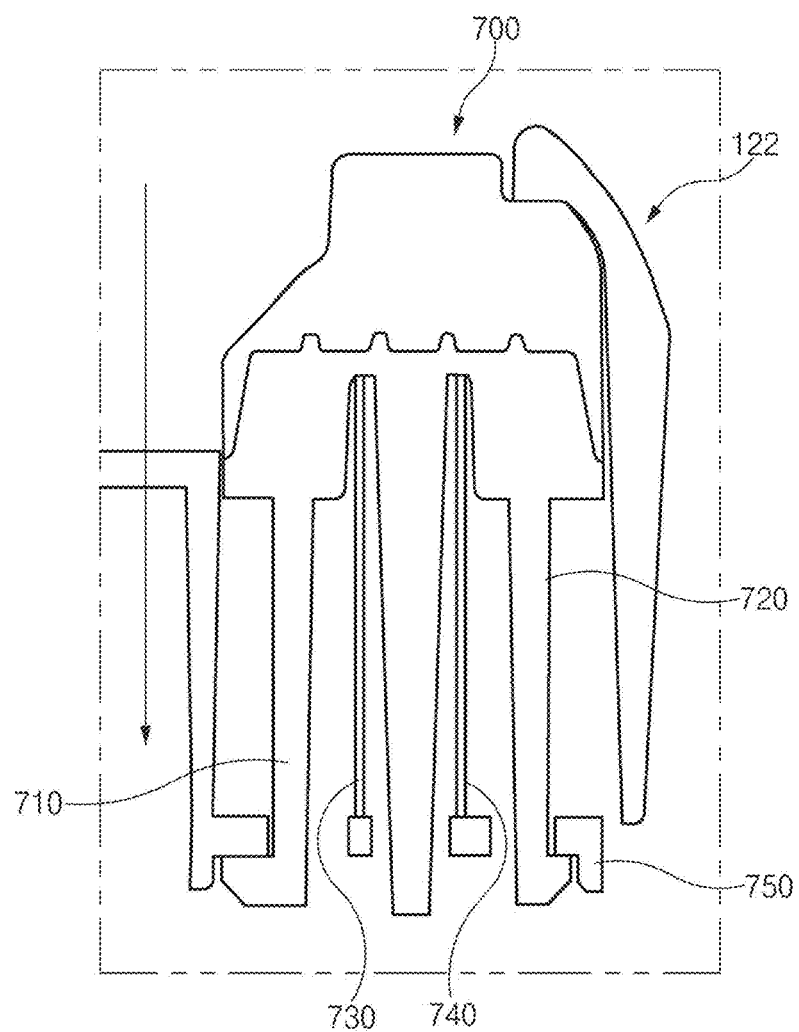
FIG. 9B is a view illustrating a coupling state of a side wall protector and a front case according to an embodiment of the present disclosure.

FIG. 9B is a view illustrating a coupling state of a side wall protector and a front case according to an embodiment of the present disclosure.

Referring to FIG. 9B, at least one device side wall protecting part 700 may be arranged on one side of the front case 122 (for example, a peripheral area). The device side wall protecting part 700, for example, may include a first side wall protector 710, at least a portion of an upper end of which is exposed from the bottom of the seating area 122a of the front case 122 while the first side wall protector 710 is seated in the front case 122 through the first resilient part 730 to be fixed, and a second side wall protector 720, at least a portion of an upper end of which is exposed from the bottom of the seating area 122a of the front case 122 while the second side wall protector 720 is seated in the front case 122 through the second resilient part 740 to be fixed.

Accordingly, when a pressure is applied from an upper side of the first side wall protector 710 or the second side wall protector 720 downwards (for example, the electronic device 200 is coupled to the front case 122), the first side wall protector 710 or the second side wall protector 720 may support a side wall of the electronic device 200 while retreating to the rear side of the front case 122 by at least a length.

Figure 10:
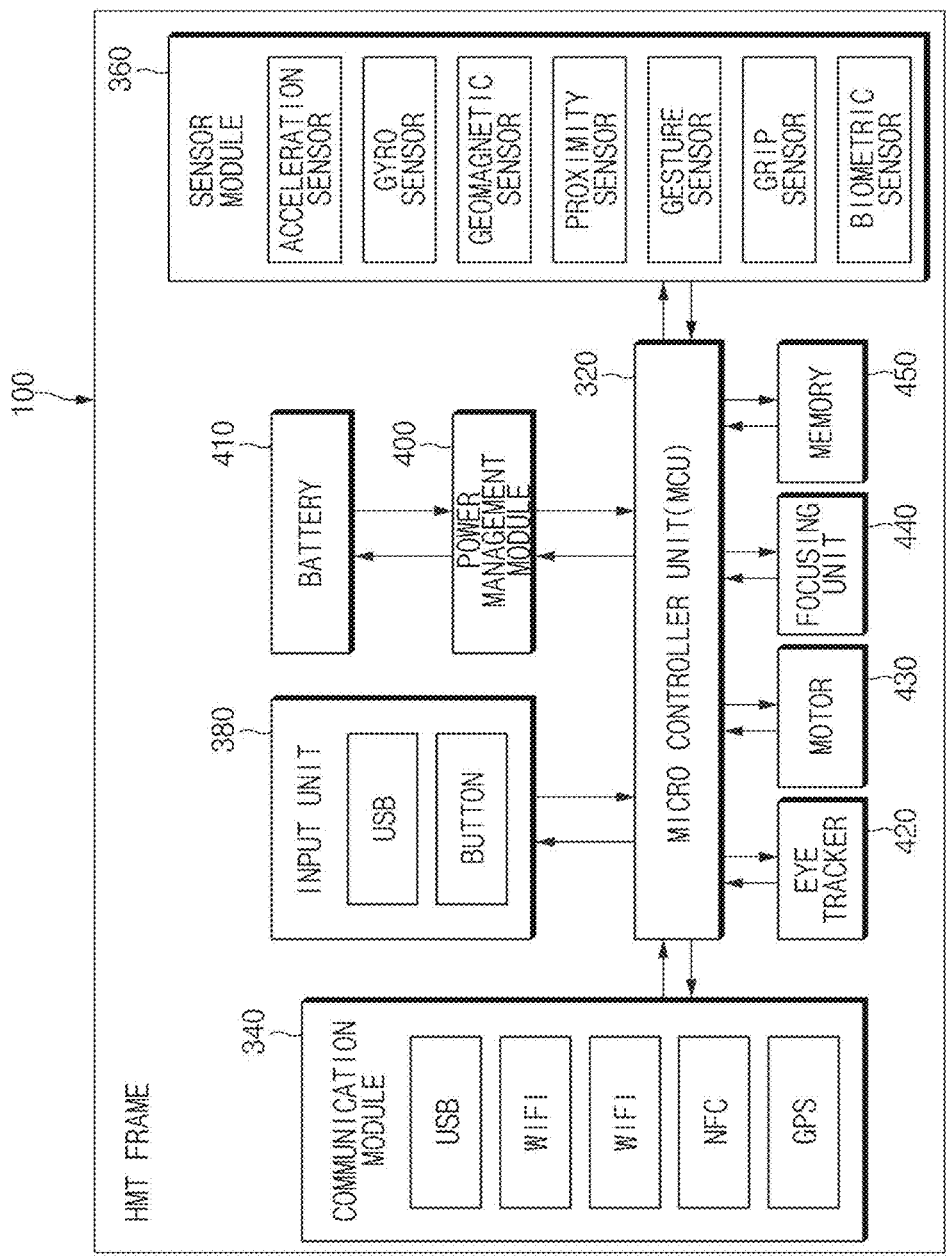
FIG. 10 is a block diagram schematically illustrating a configuration of a HMD device according to an embodiment of the present disclosure.

FIG. 10 is a block diagram schematically illustrating a configuration of a HMD device according to an embodiment of the present disclosure.

Referring to FIG. 10, the HMD device 100 according to various embodiments of the present disclosure may include a micro controller unit (MCU) 320, a communication module 340, a sensor module 360, an input unit 380, a power management module 400, a battery 410, an eye tracker 420, a motor 430, a focusing unit or a lens assembly 440, and a memory 450.

Other elements (for example, a display) are not illustrated in the block diagram for convenience of description.

In other embodiments, some of the elements illustrated in the block diagram may be included in the main frame 110 and the other elements may be included in a display device (for example, a detachable smartphone) of the electronic device 200.

The MCU 320, for example, may include a processor, and may drive an operating system (OS) or an embedded software program to control a plurality of hardware elements connected to the MCU 320.

The communication module 340 may electrically connect the main frame 110 of the HMD device 100 according to the present disclosure and the electronic device 200, for example, a smartphone terminal to transmit and receive data by using a wired and/or wireless communication.

According to an embodiment, the communication module 340 may include a USB module, a Wireless Fidelity (Wi-Fi) module, a Bluetooth (BT) module, a near field communication (NFC) module, and a global positioning satellite (GPS) module.

According to another embodiment, at least some (for example, two or more) of the Wi-Fi module, the BT module, the GPS module, or the NFC module may be included in one integrated chip (IC) or IC package.

The sensor module 360 may measure a physical quantity or sense an operating state of the HMD device 100 and may convert the measured or sensed information into an electric signal. The sensor module 360, for example, may include at least one of an acceleration sensor, a gyro sensor, a geomagnetic sensor, a magnetic sensor, a proximity sensor, a gesture sensor, a grip sensor, or a biometric sensor.

A motion of the head of the user, on which the HMD device 100 is mounted, may be detected by using an acceleration sensor, a gyro sensor, and a geomagnetic sensor.

The mounting of the HMD device 100 may be detected by using a proximity sensor or a grip sensor.

In an embodiment, at least some elements of the sensor module 360 may be included in a smartphone of the detachable electronic device 200.

According to an embodiment, mounting of the HMD device 100 by the user may be detected by detecting at least one of recognition of an IR, recognition of a pressure, or a change in capacitance (or permittivity).

The gesture sensor may detect a motion of a hand or a finger of the user to receive the motion as an input operation of the HMD device 100 according to the present disclosure.

Additionally, or alternatively, the sensor module 360, for example, may recognize biometric information of the user by using a biometric recognition sensor such as an E-nose sensor, an electromyography (EMG) sensor, an electroencephalogram (EEG) sensor, an electrocardiogram (ECG) sensor, or an iris sensor.

The sensor module 360 may further include a control circuit for controlling one or more sensors included therein.

The input unit 380 may include a touch pad 112 and a button. The touch pad 112, for example, may recognize a touch input in at least one of a capacitive scheme, a resistive scheme, an infrared scheme, and an acoustic wave scheme. The touch pad 112 may further include a control circuit. A capacitive touch panel may recognize a physical contact or a proximity. The touch pad 112 further include a tactile layer. In this case, the touch pad 112 may provide a haptic reaction to the user, and the button, for example, may include a physical button, an optical key, or a keypad.

The eye tracker 420, for example, may track an eye of the user by using at least one of an electrical oculography (EOG) sensor, a coil system, a dual Purkinje system, a bright pupil system, or a dark pupil system. Further, the eye tracker 420 may further include a micro camera for tracking eye movement. The focusing unit 440 may measure an inter-pupil distance (IPD) of the user such that the user may watch an image suitable for his or her eye sight to adjust a distance of the lens and a location of the display of the electronic device 200.

The memory 450 may include an internal memory or an external memory. For example, the internal memory may include at least one of a volatile memory (for example, a dynamic random access memory (DRAM), a static RAM (SRAM), a synchronous dynamic RAM (SDRAM), or the like) or a non-volatile memory (for example, a one time programmable read only memory (OTPROM), a programmable ROM (PROM), an erasable and programmable ROM (EPROM), an electrically erasable and programmable ROM (EEPROM), a mask ROM, a flash ROM, a NAND flash memory, a NOR flash memory, or the like). According to an embodiment, the internal memory may be a solid state drive (SSD). The external memory may further include a flash drive, for example, a compact flash (CF), a secure digital (SD), a micro secure digital (Micro-SD), a mini secure digital (Mini-SD), an extreme digital (xD), or a memory stick. The external memory may be functionally connected to the HMD device 100 through various interfaces. According to an embodiment, the HMD device 100 may further include a storage device (or storage medium) such as a hard disc drive.

The memory 450 may store instructions or data or data generated by the communication module 340, the input unit 380, and the sensor module 360. The memory 450 may include program modules such as a kernel, middleware, an application programming interface (API), or an application.

The kernel may control or manage system resources (for example, the MCU 320 or the memory 450) used to execute an operation or a function implemented in program modules (for example, middleware, the API, or the application) other than the kernel.

The kernel may provide an interface by which the middleware, the API, or the application may access an individual element of the HMD to control or manage the individual element.

The middleware may perform a function of a relay such that the API or the application may transmit and receive data to and from the kernel through communications. In relation to requests for operations received from applications, the middle ware may allocate a priority by which system resources (for example, the MCU 320 or the memory 450) of the HMD device 100 to at least one of the applications to control (schedule or load-balance) the requests.

The API is an interface for controlling a function provided by the kernel or the middleware. For example, the API may include at least one interface or function (for example, an instruction) for control a file, control a window, process an image, or control a letter.

The applications may include a short message service (SMS)/multimedia message service (MMS) application, an e-mail application, a calendar application, an alarm application, a health care application (for example, an application for monitoring physical activity or blood glucose), and an environmental information application (for example, an application for providing atmospheric pressure, humidity, or temperature information). Additionally, or alternatively, the application may be an application related to exchange of information between the HMD device 100 and the electronic device 200. For example, the information exchange application may include a notification relay application for forwarding specific information to an electronic device 200, or a device management application for managing an electronic device 200.

For example, the notification relay application may include a function of delivering notification information generated in another application (for example, an SMS/MMS application, an e-mail application, a health care application, or an environmental information application) of the HMD device 100 to the electronic device 200. Additionally, or alternatively, the notification relay application may receive notification information from the electronic device 200 to provide the received notification information to the user. For example, the device management application may manage (for example, install, delete, or update) functions for at least a part of the electronic device 200 communicating with the HMD device 100 (for example, turning on/off the electronic device 200 itself (or some elements thereof) or adjusting brightness (or resolution) of a display), applications operating in the electronic device 200, or services (for example, a telephone call service or a message service) provided from the electronic device 200.

FIG. 11 is a view illustrating a normal mode, a head mounted mode (HMM), or a VR mode of an HMD device 100 according to an embodiment of the present disclosure.

The HMM or VR mode is a mode that provides at least one of a see-through mode of providing an AR or a see-closed mode of providing a VR through a display, and for example, when a smartphone is mounted on the main frame 110 of the HMD device 100 according to the present disclosure as the electronic device 200, a general mode may be converted to the HMI mode or the VR mode. The HMI mode or VR mode may be expressed such that one image is separated into two images. According to an embodiment, because the HMI mode or the VR mode may cause distortion of an image by the lens 260 included in the main frame 110, the planar image may be inversely distorted according to the characteristics of the lens 260 to provide an undistorted image to the user.

FIG. 12 is a view illustrating that an HMD device 100 provides a see-through mode by using a rear camera of a smartphone according to an embodiment of the present disclosure.

Referring to FIG. 12, the HMD device of the present disclosure is the electronic device 200, and may provide a see-through mode by using a rear camera of the smartphone.

As an embodiment, in the method for providing a see-through mode, the rear camera of the smartphone may be executed if a see-through mode switching button is pressed in the VR mode. Then, a preview screen associated with an image captured by the rear camera may be displayed in an area of an existing VR screen in a picture-to-picture (PIP) form, and a VR screen may be switched to a background and a camera preview screen may be expanded to the entire screen to be shown. Through this, the user may identify a surrounding environment through an image if necessary while experiencing an external virtual environment.

According to various embodiments of the present disclosure, because various types of electronic devices may be mounted on and fixed to a head mounted display device without the form of the electronic device being limited, a head mounted display device having the same form regardless of the type of the electronic device may be provided.

The embodiments disclosed in the present disclosure and the drawings are provided to help easily explain the technical contents of the present disclosure and suggests specific examples for helping understanding of the embodiments of the present disclosure, but the scope of the embodiments of the present disclosure is not limited thereto.

While the present disclosure has been shown and described with reference to various embodiments thereof, it will be understood by those skilled in the art that various changes in form and details may be made therein without departing from the spirit and scope of the present disclosure as defined by the appended claims and their equivalents. Accordingly, the scope of the present disclosure should be understood as to include any and all modifications that may be made without departing from the technical spirit of the present disclosure. Those skilled in the art will appreciate that the features described above can be combined in various ways to form multiple variations of the invention.

What is claimed is:
1. A head mounted display device comprising:
   a main frame including a lens;
   a front case including a seating area in which an electronic display device is seated and a peripheral area that surrounds at least a portion of a periphery of the electronic display device;
   a connector holder horizontally movable from one side of the peripheral area with respect to a bottom of the seating area and that is electrically connected to a connection port of the electronic display device while surrounding at least a portion of one side of the electronic display device when the electronic display device is mounted; and
   a fixing holder horizontally movable from one side of the peripheral area with respect to the bottom of the seating area of the front case and that surrounds a portion of an opposite side surface of the electronic display device when the electronic display device is mounted.

2. The head mounted display device of claim 1, wherein the connector holder comprises:
   a binder horizontally moved by an external pressure while being electrically connected to the electronic display device, and
   a support member to guide horizontal movement of the binder.

3. The head mounted display device of claim 2, wherein the binder comprises:
   a resilient member that is responsible for restoration of rotation in a first direction with respect to the bottom of the seating area of the front case.

4. The head mounted display device of claim 2, wherein the support member is horizontally moved by a second external pressure applied horizontally after being pressed by a first external pressure applied from the first direction to a second direction.

5. The head mounted display device of claim 4, wherein the support member comprises:
   a resilient member that is responsible for restoration of the state in which the support member is pressed by the first external pressure,
   a slide button coupled to the resilient member,
   a slide support coupled to the slide button and that has a protrusion,
   a slide cap including at least one recess that is coupled to or separated from the protrusion of the slide support according to presence of the first external pressure, and
   a connecting slider in which the binder is seated, and
   wherein the connecting slider is horizontally moved on the slide cap by the second external pressure.

6. The head mounted display device of claim 2, further comprising:
   a plurality of exposure holes provided on one side of the seating area of the front case to expose at least a portion of the connector holder; and
   a plurality of print areas arranged adjacent to the plurality of exposure holes.

7. The head mounted display device of claim 6, further comprising:
   an indicator provided on one side of the support member,
   wherein the indicator is exposed through any one of the plurality of exposure holes while a portion of the support member is moved.

8. The head mounted display device of claim 2, wherein the fixing holder comprises:
   a holder part coupled to at least a portion of a side surface of the electronic display device, and
   a support part to support horizontal movement and rotation of the holder part.

9. The head mounted display device of claim 8, further comprising:
   a resilient member to provide a resilient force responsible for restoration of the holder part while the holder part is moved in a direction by an external pressure.

10. The head mounted display device of claim 8, wherein the holder part comprises:
    a fixing part body that has a semicircular form that surrounds one side of a side surface of the electronic display device and in which a protruding length of an area that surrounds a first side surface of the electronic display device is shorter than a protruding length of an area that surrounds a second side surface of the electronic display device.

11. The head mounted display device of claim 10, wherein the fixing part body comprises:
    a support bar to surround the second side surface of the electronic display device, and
    a stopping element that is arranged below the support bar to restrain a movement distance of the holder part in the first direction.

12. The head mounted display device of claim 8, further comprising:
    a hook that is coupled to one side of the holder part,
    wherein the hook is fixed after the holder part is rotated from a state in which the holder part is moved by a designated length or more.

13. A coupler on which an electronic device is mounted, the coupler comprising:
    a front case including a seating area in which the electronic device is seated and a peripheral area that surrounds a periphery of the electronic device,
    wherein the front case comprises:
       a connector holder horizontally movable from one side of the peripheral area with respect to a bottom of the seating area of the front case and electrically connected to a connection port of the electronic device while surrounding at least a portion of a side surface of one side of the electronic device when the electronic device is mounted, and
       a fixing holder horizontally movable from one side of the peripheral area with respect to the bottom of the seating area of the front case and that surrounds a portion of an opposite side surface of the electronic device when the electronic device is mounted.

14. The coupler of claim 13, wherein the connector holder further comprises:
    a binder horizontally moved by an external pressure while being electrically connected to the electronic device and comprising a first resilient member that is responsible for restoration of rotation in a first direction with respect to the bottom of the seating area of the front case, and
    a support member to guide horizontal movement of the binder.

15. The coupler of claim 14,
    wherein the support member comprises:
       a second resilient member that is responsible for restoration of the state in which the support member is pressed by the first external pressure,
       a slide button coupled to the second resilient member,
       a slide support coupled to the slide button and that has a protrusion,
       a slide cap including at least one recess that is coupled to or separated from the protrusion of the slide support according to presence of the first external pressure, and
       a connecting slider in which the binder is seated, and
    wherein the connecting slider is horizontally moved on the slider cap by a second external pressure.

16. The coupler of claim 15, wherein the fixing holder comprises:
    a holder part coupled to at least a portion of a side surface of the electronic device,
    a support part to support horizontal movement and rotation of the holder part, and
    a third resilient member that provides a resilient force responsible for restoration of the holder part while the holder part is moved in a direction by a third external pressure.

17. The coupler of claim 16, wherein the holder part comprises:
a fixing part body that has a semicircular form that surrounds one side of the side surface of the electronic device and in which a protruding length of an area that surrounds a first side surface of the electronic device is shorter than a protruding length of an area that surrounds a second side surface of the electronic device.

18. The coupler of claim 16, further comprising, at least one of:
a hook that is coupled to one side of the holder part, wherein the hook is fixed after the holder part is rotated from a state in which the holder part is moved by a designated length or more; or
a cover removably coupled to the front case, wherein the electronic device is arranged between the front case and the cover when the electronic device is mounted.

19. The coupler of claim 14, further comprising:
a plurality of exposure holes provided on one side of the seating area of the front case to expose at least a portion of the connector holder; and
a plurality of print areas arranged adjacent to the plurality of exposure holes.

20. The coupler of claim 19, further comprising:
a movement support; and
an indicator provided on one side of the movement support,
wherein the indicator is exposed through any one of the plurality of exposure holes while a portion of the support member is moved.

* * * * *